United States Patent
Morzano et al.

(10) Patent No.: US 6,556,494 B2
(45) Date of Patent: Apr. 29, 2003

(54) HIGH FREQUENCY RANGE FOUR BIT PREFETCH OUTPUT DATA PATH

(75) Inventors: Christopher K. Morzano; Wen Li, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/808,506

(22) Filed: Mar. 14, 2001

(65) Prior Publication Data

US 2002/0131313 A1 Sep. 19, 2002

(51) Int. Cl.[7] .................................................. G11C 7/00
(52) U.S. Cl. .................... 365/219; 365/189.05; 365/233
(58) Field of Search .......................... 365/219, 189.05, 365/233, 230.08, 220, 221, 189.4, 230.09

(56) References Cited

U.S. PATENT DOCUMENTS 5,828,618 A    10/1998  Hosotani et al. ............. 365/221
5,999,458 A *  12/1999  Nishimura et al. ..... 365/189.05
6,084,823 A *   7/2000  Suzuki et al. ................ 365/233
6,324,118 B1   11/2001  Ooishi ......................... 365/233

FOREIGN PATENT DOCUMENTS

JP       2000-076853        3/2000      ......... G11C/11/407

OTHER PUBLICATIONS

"DDR–II SDRAM Specification", *JEDEC Meeting, JC 42.3*, pp. 1–43, (Sep. 2000).

* cited by examiner

*Primary Examiner*—David Lam
(74) *Attorney, Agent, or Firm*—Schwegman, Lundberg, Woessner & Kluth, P.A.

(57) ABSTRACT

A method of transferring a plurality of data bits from memory cells to a data pad via a plurality of output paths. Each of the output paths receives the data bits in parallel and selects one bit among the data bits. Selected bits from each of the output paths is transferred to an output select. A plurality of timing signals are activated in sequence based on alternate phases of two enable signals to serially transfer the data bits from the output select to the data pad.

43 Claims, 19 Drawing Sheets

US 6,556,494 B2

HIGH FREQUENCY RANGE FOUR BIT PREFETCH OUTPUT DATA PATH

TECHNICAL FIELD OF THE INVENTION

The present invention relates generally to integrated circuits, and in particular to a data path in a memory device.

BACKGROUND OF THE INVENTION

Semiconductor memory devices such as synchronous dynamic random access memory (SDRAM) devices are widely used in computers and electronic products. A SDRAM device typically has a large number of memory cells to store the data. To read the data, a memory read operation is performed. During a read operation, data from the memory cells are accessed and output to a data pad for processing. The operation of the SDRAM is based on a common clock signal.

There are several variations of SDRAM devices. In one variation, data from the memory cells are accessed and one bit of data is output to the data pad in every clock cycle. In another variation of SDRAM devices, two bits of data are accessed and output to the data pad in every clock cycle; thus, this variation of SDRAM devices is commonly referred to as double data rate (DDR) SDRAM device.

Currently a new variation of SDRAM devices has been proposed by Joint Electronic Device Engineering Council (JEDEC), an international organization that sets standards for integrated circuit devices including memory devices. A draft of a specification for the SDRAM device proposed by JEDEC is incorporated herein as a reference. In the proposed SDRAM device or DDR II SDRAM device, four bits of data within the memory device are accessed and output to the data pad during a read cycle. Thus, a DDR II SDRAM device outputs data at a higher speed than a traditional DDR SDRAM device.

One of the challenges of operating a DDR II SDRAM device is implementing the device so that the four bits of data from the memory cells are properly output to the data pad. In a DDR SDRAM device, since a group of two bits of data are accessed at a time, two bits from one group can be output to the data pad in one clock cycle. In the next clock cycle, the next group of two bits can also be output to the data in the same fashion as the previous group. Thus, in every two clock cycles, four bits are output to the data pad; the four bits are from two different groups. In the DDR II SDRAM device, a group of four bits are accessed at a time and are output to the data pad in two clock cycles, two bits in each of the two clock cycles. However, unlike the DDR SDRAM, since the four bits are from the same group, the DDR II SDRAM device must distinguish which two of the four bits to output in which one of the two clock cycles. In addition, a proper bit order must also be determined so that each of the four bits is output to the data pad in a right order.

There is a need for an implementation in a DDR II SDRAM in which data is properly output from the memory cells to the data pad during a read operation.

SUMMARY OF THE INVENTION

The present invention is a DDR II SDRAM device having an output circuit to implement data transfer between memory cells and data pads of the memory device.

In one aspect, the memory device includes a plurality of input nodes to receive a group of M bits of data from the memory cells in parallel. N output paths are connected between the input nodes and the data pad, in which M and N are greater than two. Each of the output paths transfers a different bit of the group of M bits of data. The M bits of data are transferred to the data pad in series by activating a plurality of timing signals. The timing signals are activated by a first and a second enable signals. The enable signals are not synchronized.

In another aspect, a method of transferring data is provided. The method includes reading M bits of data in parallel to a plurality of output paths, in which M is greater than two. The method also includes transferring the M bits of data from the output paths to an output select. Each of the output paths transfers a different bit of data. The method also includes activating a first and second enable signals and a plurality of timing signals. The timing signals are activated in series based on the enable signals. The method further includes transferring the M bits of data in series to an output stage following transitions of the timing signals, and outputting the M bits of data to a data pad within two cycles of a clock signal.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
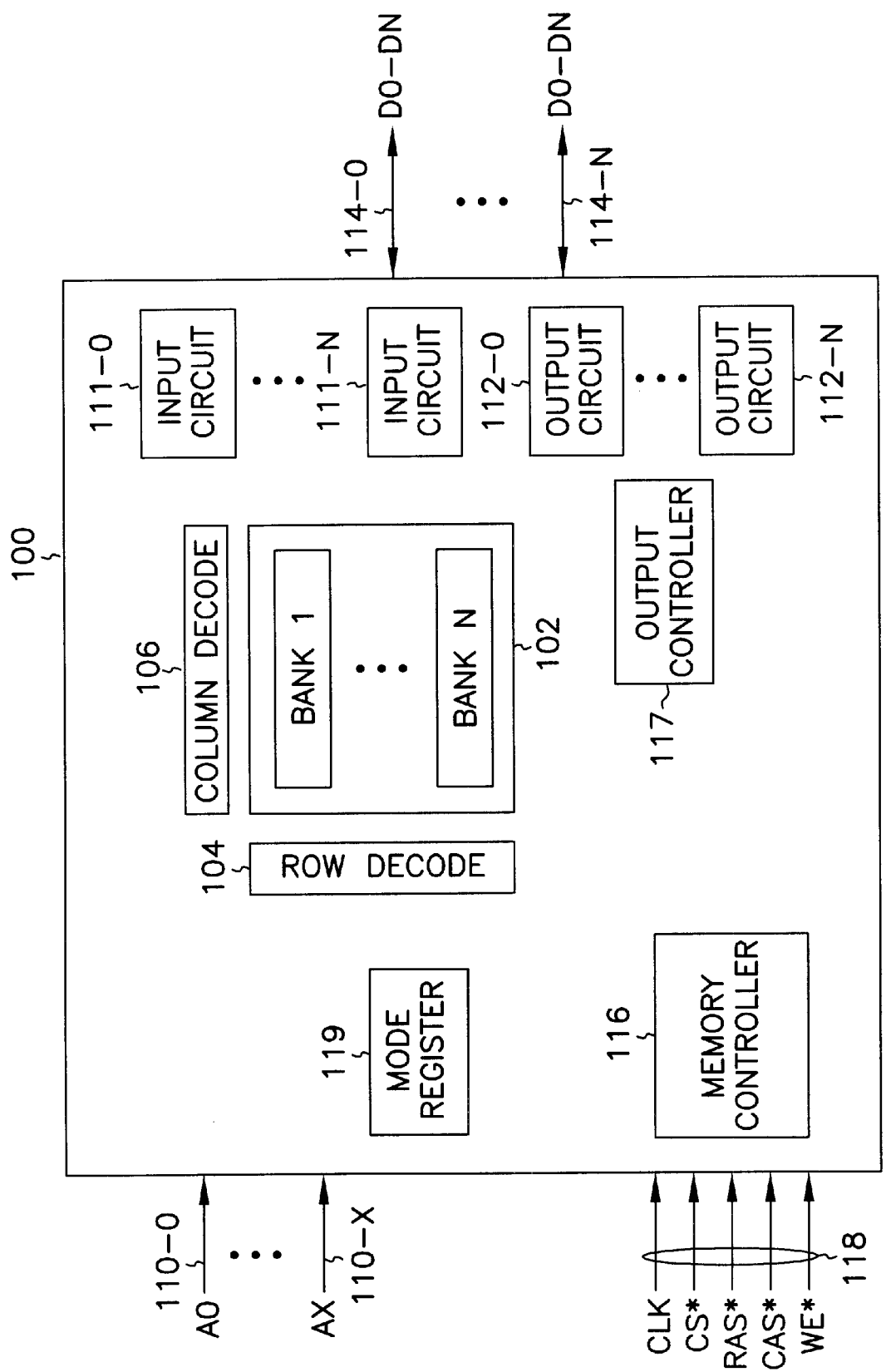
FIG. 1 is a block diagram of memory device according to one embodiment of the invention.

FIG. 1 is a simplified block diagram of a memory device 100 according to one embodiment of the invention. In one embodiment, memory device 100 includes a main memory 102. Main memory 102 typically includes dynamic random access memory (DRAM) devices which include one or more memory banks, indicated by BANK 1–N. Each of the memory banks BANK 1–N includes a plurality of memory cells arranged in rows and columns. Row decode 104 and column decode 106 access individual memory cells in the rows and columns in response to an address, provided on address bus or address lines 110 0–X. Address lines 110 1–X receive a plurality of address signals A0–AX. A plurality of input circuits 111 0–N and a plurality of output circuits 112 0–N connect to data bus or data lines 114 0–N for bi-directional data communication with main memory 102. Each of the data lines 114 0–N provides a plurality of data signals or a plurality of bits of data D0–DN. An output controller 117 controls timing of data output from main memory 102 to data pads 114 0–N. A memory controller 116 controls memory 100 responding to control signals provided on control lines 118. The control signals include, but are not limited to, an external clock signal (CLK), Chip Select (CS*), Row Access Strobe (RAS*), Column Access Strobe (CAS*), and Write Enable (WE*). Memory device 100 also includes a mode register 119, which can be programmed to store various settings for the operation of memory device 100.

It will be appreciated by those skilled in the art that the memory device 100 of FIG. 1 can include additional circuitry and control signals, and that the memory device of FIG. 1 has been simplified to help focus on the invention. It will be understood that the above description of a DRAM is intended to provide a general understanding of the memory and is not a complete description of all the elements and features of a DRAM device.

Throughout the description of the invention, terms such as data, bit, data bit or bit of data are used interchangeably to describe the same subject, which is the information or signal read from or written into main memory 102. Moreover, terms such as line and node are used interchangeably; they refer to the same element.

Figure 2:
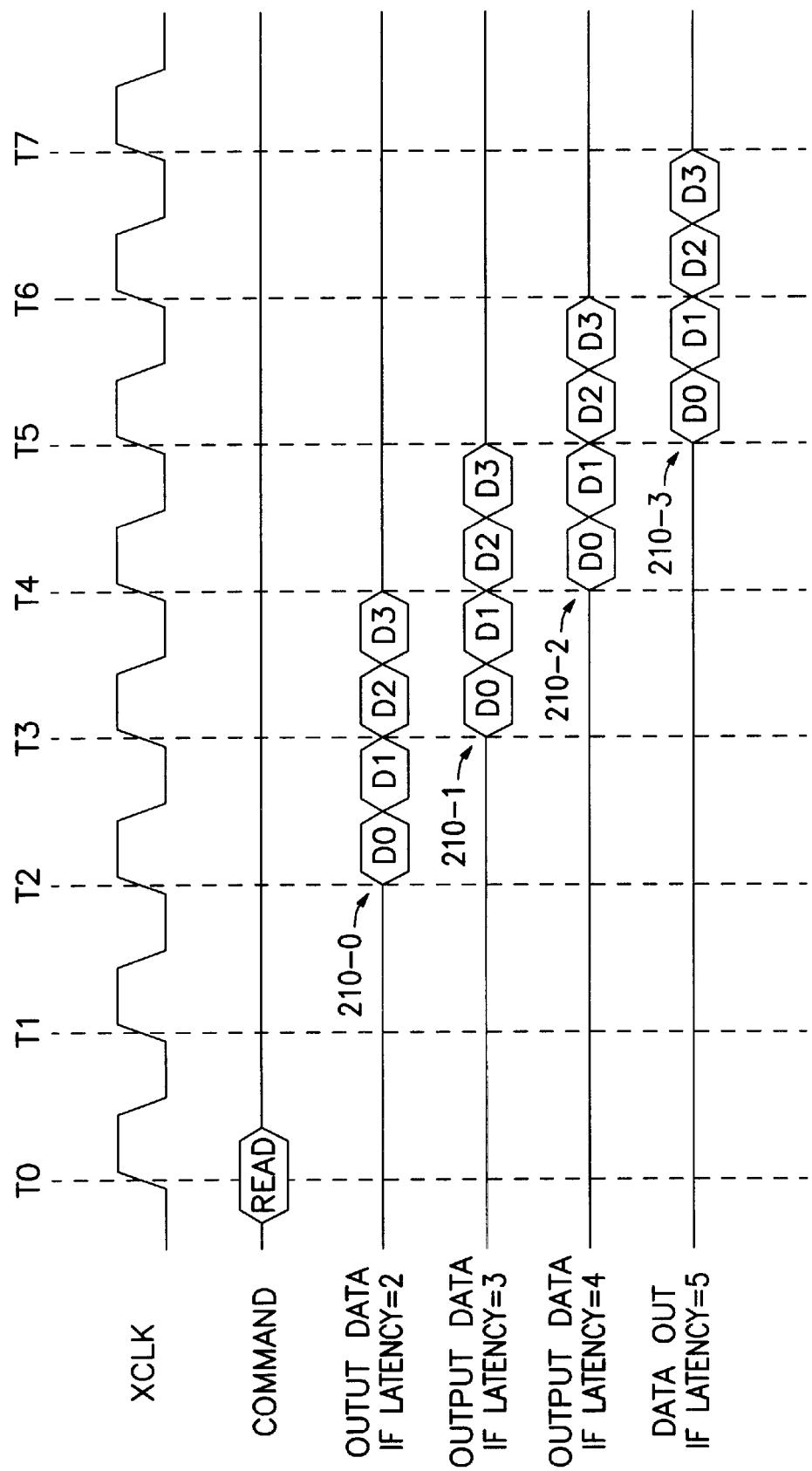
FIG. 2 is a timing diagram of FIG. 1 during a memory operation at various latency settings.

FIG. 2 is a timing diagram of FIG. 1 during a memory operation at various latency settings. In FIG. 2, CLK represents the external clock signal applied to memory device 100 on one of the control lines 118 of FIG. 1. In one embodiment, memory device 100 can operate with the CLK signal having a frequency range of 66 Mega Hertz (66 MHZ) to 300 Mega Hertz (300 MHZ). COMMAND represents a command applied to memory device 100 to perform certain memory operation such as a read operation. OUTPUT DATA 210 0–3 represents output data provided at one of the lines 114 0–N of FIG. 1. Each of the OUTPUT DATA 210 0–3 represents output data at a different latency setting. The latency setting is set by programming mode register 119 of FIG. 1. Different latency settings provide different timing for when a first bit of data is available at one of the data lines 114 0–N after a read command is issued. For example, if the latency is set at 2, a first bit of data D1 is available 2 clock cycles after the READ command. In FIG. 2, the READ command occurs at time T0, the first bit of data D1 of OUTPUT DATA 210-0 is available at time T2, which is two clock cycles after the READ command. Similarly, OUTPUT DATA 210 1–3 indicate that if the latency setting is at 3, 4 or 5, the first bit of data is available at T3, T4 or T5, which are three, four or five clock cycles after the READ command. Latency setting is chosen depending on variables external to memory device 100.

Memory device 100 of FIG. 1 can output a series of 4 bits of data in each read burst of a read operation. In a read operation, memory controller 116 checks for a certain combination of command signals such as signal RAS*, CAS* and WE*. If the combination is valid for a read operation, a read command is issued. For example, in FIG. 2, at time T0, after a combination for a read operation is valid, a READ command is issued. Four bits of data in main memory 102 (FIG. 1) are read and are output to one of the output circuits 112 0–N. Reading four bits of data in main memory 102 can be done in any conventional read method. After the four bits of data are read to one of the output circuits 112 0–N, the bits are serially output to one of the data lines 114 0–N. The timing of the four bits of data output to lines 114 0–N is controlled by output controller 117 based on the latency setting. As shown in FIG. 2, four bits of data D0–D3 of each of the OUTPUT DATA 210 0–3 are output at different clock cycles after the READ command based on different latency settings. Output circuits 112 0–N and output controller 117 and their operations are described in more detail in subsequent Figures.

Figure 3:
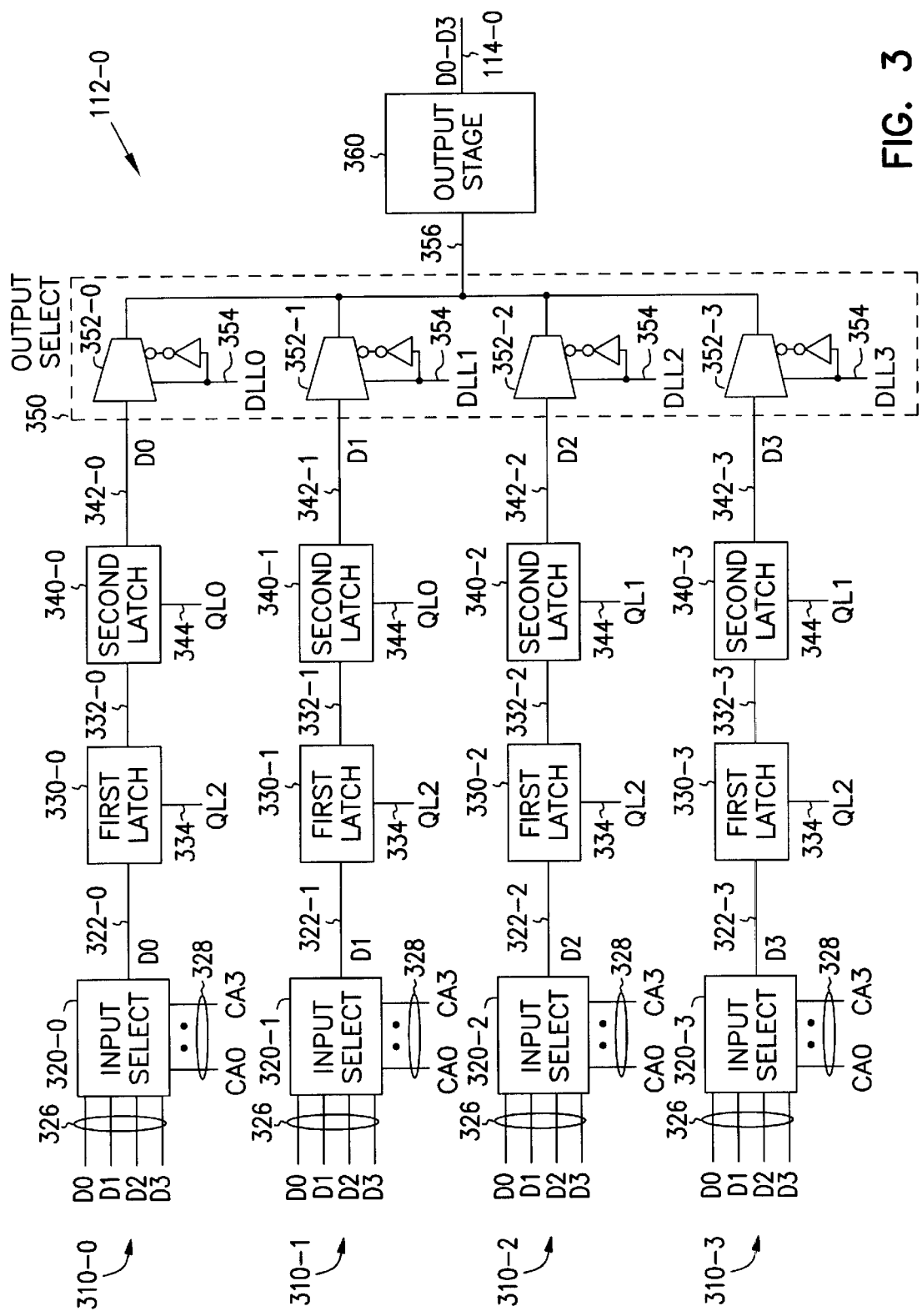
FIG. 3 is a block diagram of an output circuit of FIG. 1.

FIG. 3 is a block diagram of one of the output circuits 112 0–N of FIG. 1. In FIG. 3, output circuit 112-0 is shown. The constructions of other output circuits are the same as the construction of output circuit 112-0 shown in FIG. 3. Output circuit 112-0 has a plurality of output paths 310 0–3. An output select 350 connects to output paths 310 0–3 via lines or nodes 342 0–3. An output stage 360 connects to output select 350 through line 356. Output stage 360 connects to line 114-0 to provide a plurality of bits of data D0–DN.

Output paths 310 0–3 include a plurality of input selects 320 0–3. A plurality of first latches 330 0–3 connected to input selects 320 0–3 via lines 322 0–3. A plurality of second latches 340 0–3 connected to first latches 330 0–3 through lines 332 0–3 and to output select 350 via lines 342 0–3. The constructions output paths 310 0–3 are the same, thus, each of the output paths 310 0–3 has the same elements. For example, output path 310-0 has input select 320-0 connected to first latch 330-0 through line 322-0. Second latch 340-0 connects to first latch 330-0 through line 332-0 and to output select 350 through line 342-0. Other output paths 310 1–3 have the same arrangement as output path 310-0.

Each of the input selects 320 0–3 connect to a plurality of input nodes 326 to receive a plurality of data signals or bits of data D0–D3. These bits of data are compliment data. In other terms, each of these bits of data is an inverse of of a true data bit from main memory 102. Bits of data D0–D3 are received in parallel at nodes 326. In other words, bits D0–D3 arrive at nodes 326 from main memory 102 at the same time. Each of the input selects 320 0–3 also connects to a plurality of select lines 328 to receive a plurality of select signals CA0–CA3. Each of the first latches 330 0–3 connects to a control line 334. Each of the second latches 340 0–3 connects to a control line 344. Control lines 334 and 344 receive a plurality of propagation control signals Q0–Q2. All control lines 334 of receive signal Q2. Control lines 344 of second latches 340 0–1 receive signal Q0. Control lines 344 of second latches 340 2–3 receive signal Q1.

Output select 350 includes a plurality of multiplexors 352 0–3. Each of the multiplexors 352 0–3 has an input connected to one of the nodes 342 0–3, and an output connected to output stage 360 via line 356. Multiplexors 352 0–3 also connect to a plurality of control lines 354 to receive a plurality of timing signals DLL 0–3.

In FIG. 3, each of the input selects 320 0–3 selects one of the four bits of data D0–D3 on lines 326 and passes the selected bit to one of the corresponding lines 322 0–3. The selection of one data bit among bits D0–D3 is based on two address signals or address bits received on lines 110 0–X (FIG. 1). The address bits received on lines 110-X are A0, A1, A3, . . . , AX. Logic values (logic 1 or logic 0) of bits A1 and A0 determine the selection of the data bits by input selects 320 0–3. If logic values of A1 and A0 are 0 and 0 (binary 00) then the selection of the data bits by input selects 320 0–3 are D0, D1, D2 and D3, respectively. In other words, if the combination of A1A0 is 00, input select 320-0 selects bit D0; input select 320-1 selects bit D1; input select 320-2 selects bit D2; and input select 320-3 selects bit D3. If the combination of A1A0 is 01, then the order of the data selected by input selects 320 0–3 is D1, D2 and D3, D0, respectively. If the combination of A1A0 is 10, then the order of the data selected by input selects 320 0–3 is D2, D3, D0 and D1, respectively. If the combination of A1A0 is 11, then the order of the data selected by input selects 320 0–3 is D3, D0, D1 and D2, respectively. For example, if the combination A1A0 is 00, then in FIG. 3, four different bits of data selected by input selects 320 0–3 to lines 322 0–3 are D0, D1, D2 and D3, respectively.

Latches 330 0–3 and 340 0–3 are controlled by signals QL0–QL2. Latches 330 0–3 or 340 0–3 pass the data signals or data bit from one node to another node when the signals QL0–QL2 are activated. When QL2 is activated, or makes a transition from a low signal level (LOW) to a high signal level (HIGH), first latches 330 0–3 pass data from nodes 322 0–3 to nodes 332 0–3. When QL0 is activated, second latches 340 0–1 pass the data from nodes 332 0–1 to nodes 342 0–1. When QL1 is activated, second latches 340 2–3 pass the data from nodes 332 2–3 to nodes 342 2–3. In the example above, after QL0–QL3 are activated, bits D0–D3 are passed from lines 322 0–3 to nodes 332 0–3 and finally to nodes 342 0–3.

Output select 350 selects the data bits on nodes 342 0–3 and pass them to output stage 360 in sequential order. Timing signals DLL0–DLL3 are activated sequentially to pass the bits of data on nodes 342 0–3 output stage 360 via line 356. Thus, output select 350 passes the bits of data in series to output stage 360. The first bit of data in the series passed to output stage 360 is the bit of data one line 342-0 of output path 310-0. The second bit passed to output stage 360 is the bit of data line 342-1 from output path 310-2. In this pattern, the third and fourth bits passed to output stage 360 are from lines 342-2 and 342-3. In the example above, the first bit of data passed to output stage 360 is D0. The second, third and fourth bits passed to output stage 360 are D1, D2, and D3.

Output stage 360 receives the bits of data on line 356 and outputs them serially to line 114-0. Using the same example above, the bits of data output on line 114-0 is D0, D1, D2, and D3. Output stage 360 output the bits of data D0–D3 on output lines 114-0 as true forms. In other words, data output on line 114-0 have opposite potentials from data on line 326. The order of the data bits used in the example of this description is D0, D1, D2 and D3. However, the order of the bits of data can be in any order depending on the logic values of address bits A1 and A0 as described previously. For example, if the data on lines 342 0–3 are D1, D2, D3 and D0, respectively, then the bits of data are passed to output stage 360 is in the same order. In this case, output stage 360 also outputs the bits of data output to line 114-0 in the same order, which is D1, D2, D3 and D0. In summary, if the combination of A1A0 address bits is 00, then output order of data at line 114-0 is D0, D1, D2, and D3. If A1A0 is 01, then the output data is D1, D2, D3 and D0. If A1A0 is 10, then the output data is D2, D3, D0 and D1. If A1A0 is 11, then the output data is D3, D0, D1 and D2.

Figure 4:
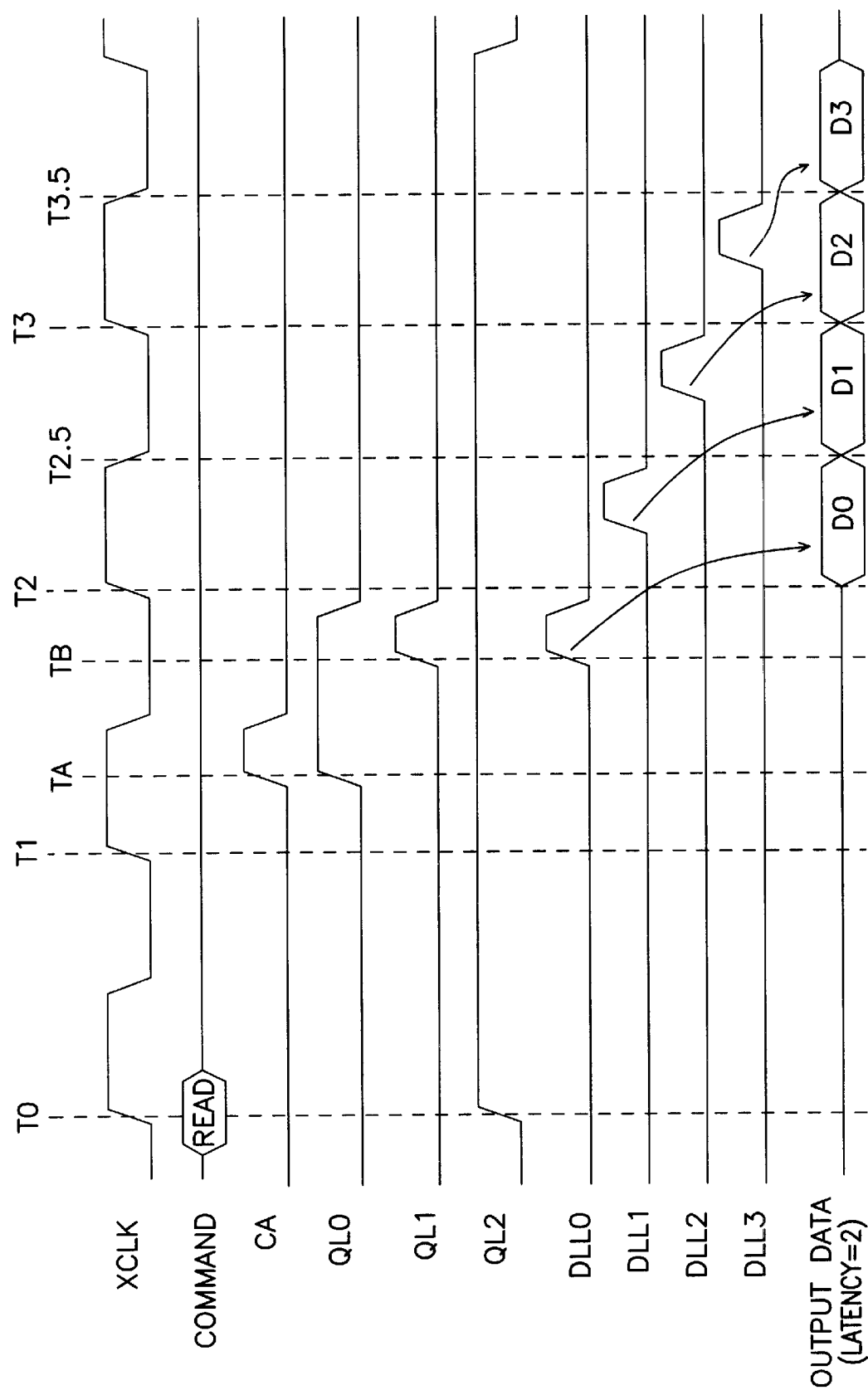
FIGS. 4–7 are timing diagrams of the operation the output circuit of FIG. 3 at different latency settings.

FIG. 4 is a timing diagram of the operation of output circuit 112-0 of FIG. 3 with latency two setting. In FIG. 4, CA signal represents one of the CA0–CA3 signals received on line 328. QL0, QL1 and QL2 signals represent the same signals received at first and second latches 330 and 340 of FIG. 3. DLL0, DLL1, DLL2 and DLL3 represent the same signals received on lines 354 of output select 350. Output data D0, D1, D2 and D3 represent output data D0–D3 on line 114-0.

The operation of FIG. 3 is described herein in conjunction with FIG. 4. Referring to FIG. 4, at time T0, a READ command is issued. Four bits of data from memory cells 102 (FIG. 1) are accessed. The four bits of data are subsequently transferred to data paths 310 0–3 of output circuit 112-0 of FIG. 3. Input selects 320 0–3 of data paths 310 0–3 receive the four bits of data D0–D3 on lines 326. At lines 326, the four bits of data are represented in their compliment forms. At time TA in FIG. 4, signal CA switches to HIGH, which allows each of the input select 320 0–3 to select one bit of data among the four bits D0–D3 on lines 326. The selected data bits are passed to lines 322 0–3. For the purpose of describing the invention, it is assumed that A1A0 is 00. Therefore, the four bits of data passed to lines 322 0–3 are D0, D1, D2 and D3, respectively. In other words, line 322-0 carries bit D0; line 322-1 carries bit D1; line 322-2 of carries bit D2; and line 322-3 carries bit D3.

In latency two, signal QL2 is always HIGH. As shown in FIG. 4, QL2 signal is HIGH from the beginning of the READ command to all clock cycles. Since QL2 is HIGH, D0–D3 on lines 322 0–3 pass through latches 330 0–3 to nodes 332 0–3. At time TA, QL0 signal switches to HIGH. This allows bits D0 and D1 to pass from nodes 332 0–1 through second latches 340 0–1 to nodes 342 0–1. At time TB, QL1 switches to HIGH. This allows bits D2 and D3 to pass from node 322 2–3 through second latches 340 2–3 to nodes 342 2–3.

At output select 350, multiplexors 352 0–3 are controlled by timing signals DLL0–DLL3. DDL0–DLL3 signals are sequentially activated such that bits D0–D3 on nodes 342 0–3 can be properly output to line 114-0 based on the latency setting. Since the latency setting is two, a first bit of data output on line 114-0 appears two clock cycles after the READ command. In this case, the first bit of data appears at time T2. To pass the first bit on node 342-0, DLL0 signal is activated. This allows bit D0 to pass from node 342-0 to node 356 and subsequently to line 114-0. Since there is a propagation delay from node 342-0 to node 114-0, signal DLL0 is activated just prior to time T2 so that when bit DO appear at line 114-0 it lines up with the rising edge of the clock signal CLK at time T2. In FIG. 4, DLL0 is activated or switches to HIGH prior to time T2. This enables bit D0 (true form) to line up with the rising edge of the CLK signal at time T2. Similarly, DLL2 is activated HIGH prior to time T3 to enable bit D2 to line up with the rising edge of the CLK signal at time T2. In the same manner, signals DLL1 and DLL3 are activated HIGH prior to times T2.5 and T3.5, respectively, to enable bits DLL1 and D3 to line up with the falling edges of the CLK signal at times T2.5 and T3.5.

Figure 5:
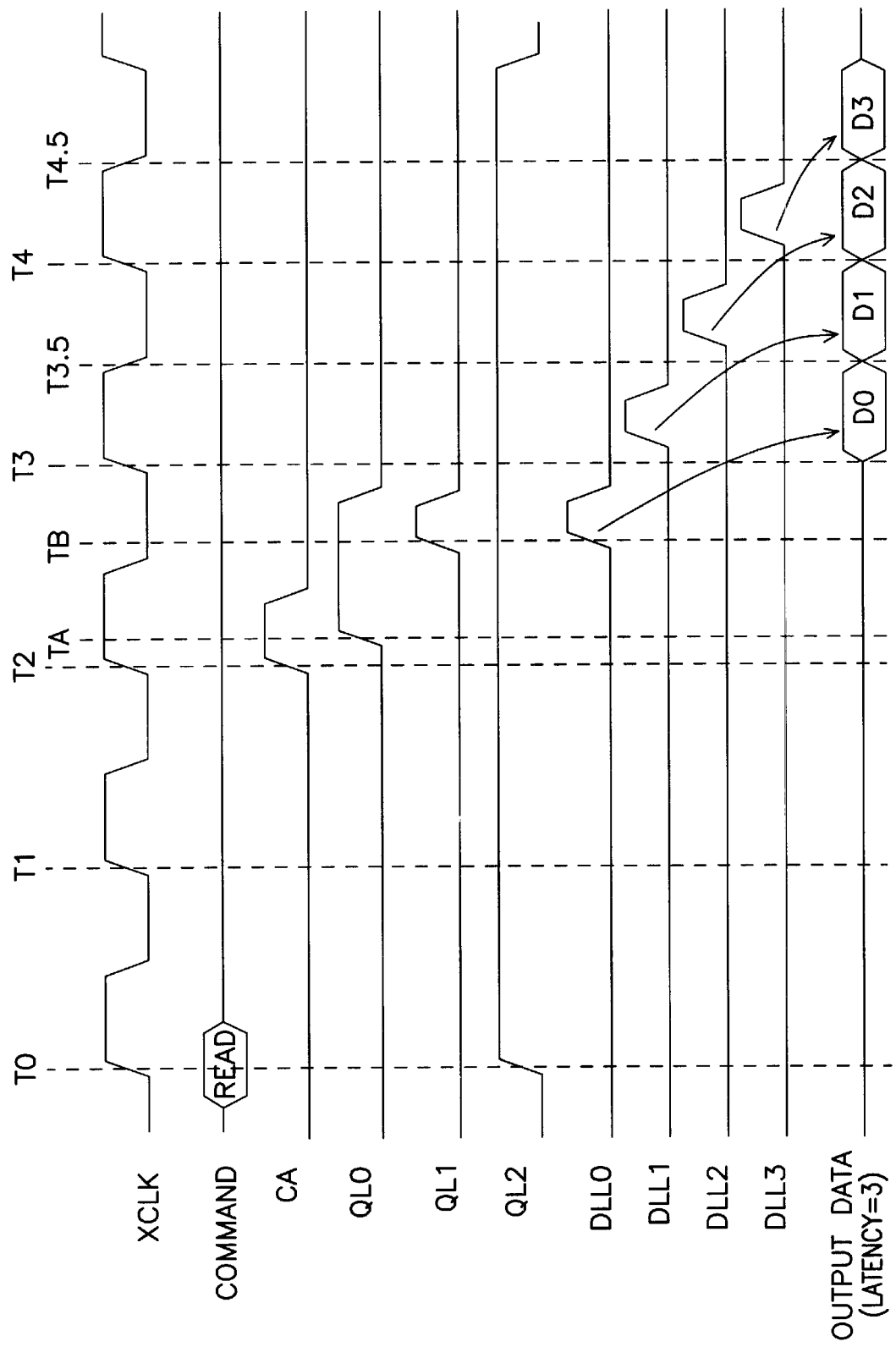

FIG. 5 is a timing diagram of the operation of output circuit 112-0 of FIG. 3 with latency three setting. In latency three, the first bit of output data appears on line 114-0 three clock cycles after the READ command is issued. In FIG. 5, D0 appears at time T3, which is three clock cycles from the READ command at time T0. In latency three, the data bits D0–D3 received on lines 326 are output to line 114-0 in the same manner as in latency two. The difference between latency two and latency tree is the timing of signals CA, QL0, QL1, and DLL0–DLL3. Since output data of latency three appears at line 114-0 one clock cycle later than output data of latency two, signal CA is activated at almost one clock cycle later. In FIG. 5, the CA signal is activated (HIGH) at time TA, which is almost one clock cycle later than time TA of FIG. 4. QL2 stays HIGH throughout the read cycle as in the case of latency two. However, other signals are activated at almost a clock cycle later as are shown in FIG. 5.

Figure 6:
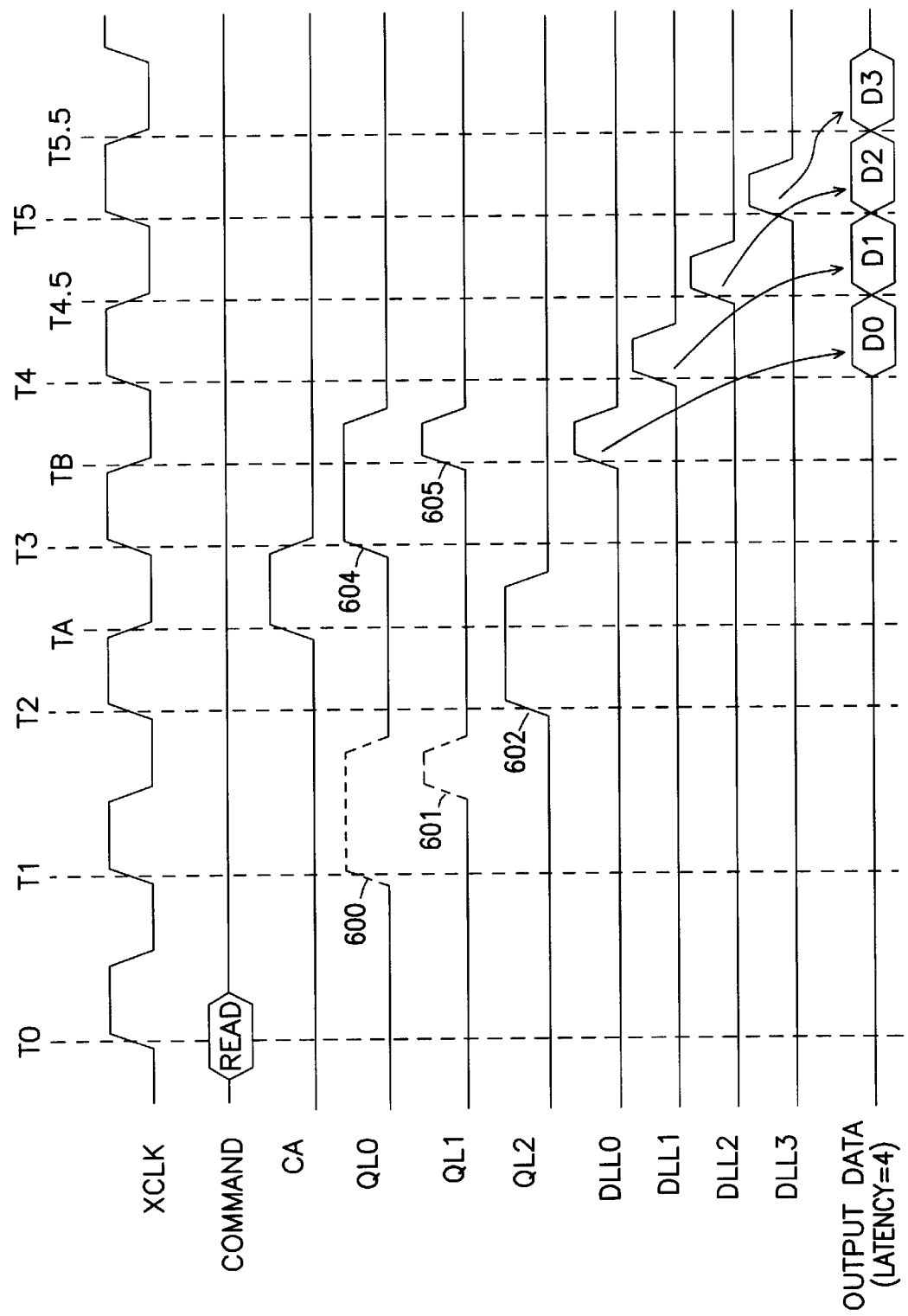

FIG. 6 is a timing diagram of the operation of output circuit 112-0 of FIG. 3 with latency four setting. In latency four, the first bit of output data appears on line 114-0 four clock cycles after the READ command is issued. In FIG. 6, D0 appears at time T4, which is four clock cycles from the READ command at time T0. In latency four, the data bits D0–D3 received on lines 326 are output to line 114-0 in the same manner as in latency two. However, a different timing scheme is provided to ensure that the last bit in one group of four bits and the first bit in the next group of four bits can also be output properly. Therefore, QL2 signal is not always HIGH as in the case of latency two and three.

In FIG. 6, the dashed portions of QL0 and QL1 indicate signals from a previous read cycle. The dashed signal at 600 and 601 indicate previous transitions of QL0 and QL1 signals. The signals at 604 and 605 are the current transitions of QL0 and QL1 in the current read cycle. The signal at 602 is the current transition of QL2 signal. In FIG. 3, to ensure that current bits D0–D3 of the current read cycle do not get mixed up with previous bits D0–D3 of the previous read cycle, previous bits D0–D3 on nodes 332 0–3 must be passed to nodes 342 0–3 before current bits D0–D3 arrive at node 332 0–3. Therefore, QL2 must be activated between transitions of QL0 and transitions of QL1 signals. In other words, QL2 must be activated after a transition of QL0 of the previous read cycle and before a transition of QL0 of the current read cycle.

As shown in FIG. 6, QL2 makes a transition at 602, which is after the transition of QL0 at 600 and before a transition of QL0 at 604. Similarly, QL2 at 602 is also after the transition of QL1 at 601 and before a transition of QL1 at 605. Therefore, when QL2 makes a transition at 602, the current bit D0–D3 on lines 322 0–3 are passed to node 332 0–3. By this time (at 602), the previous bits D0–D3 have already passed to nodes 342 0–3 by the transitions of QL0 and QL1 at 600 and 601. Thus, by properly activating signals QL0–QL3 in latency four, output circuit 112-0 properly processes bits D0–D3 in all read cycles.

Figure 7:
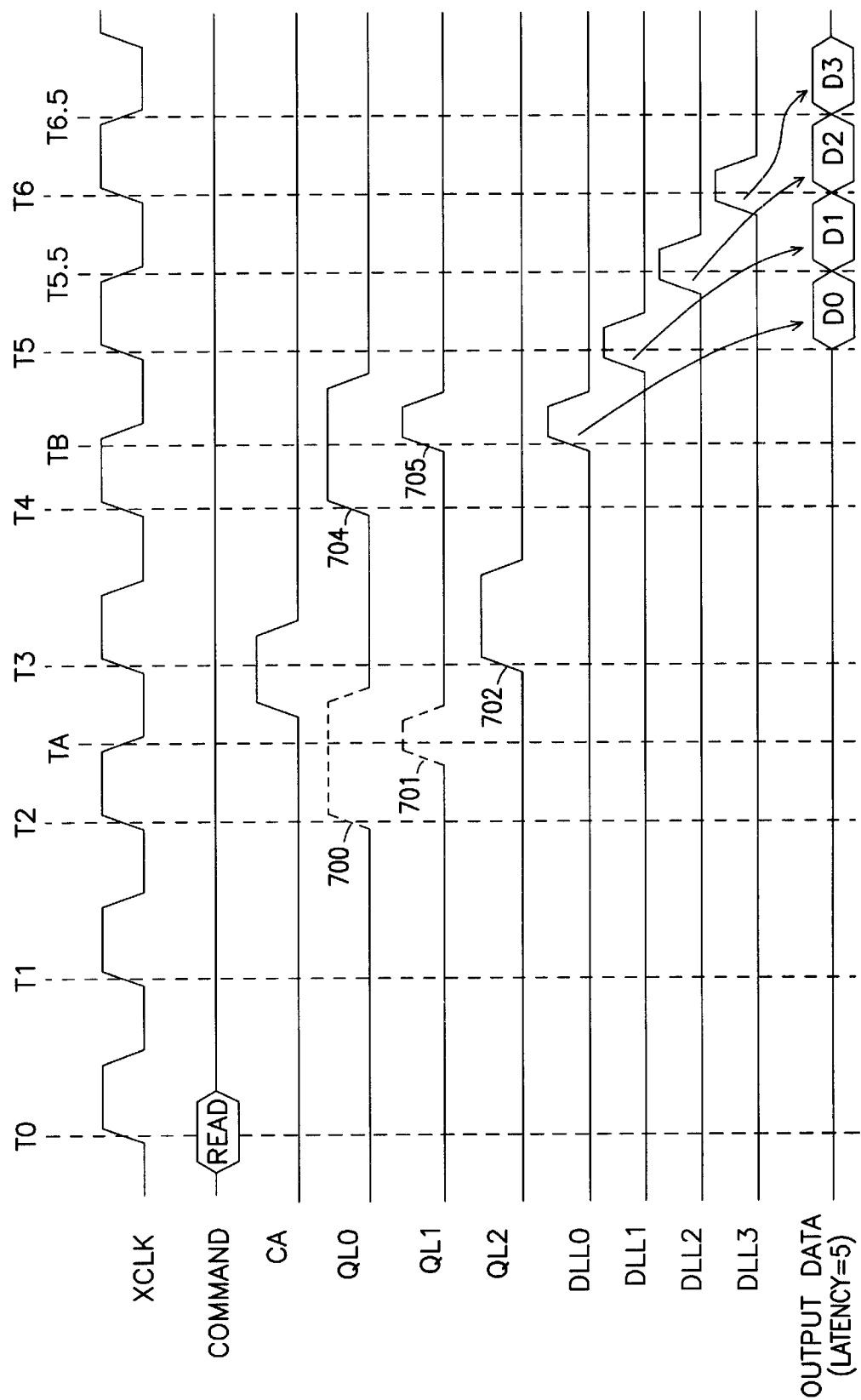

FIG. 7 is a timing diagram of the operation of output circuit 112-0 of FIG. 3 with latency five setting. With latency five, the first bit of output data appears on line 114-0 five clock cycles after the READ command is issued. In FIG. 7, D0 appears at time T5, which is five clock cycles from the READ command at time T0. In latency five, the data bits D0–D3 received on lines 326 are output to line 114-0 in the same manner as in latency two. The timing of the operation of output path 112-0 in latency five is similar to that of latency four. Similarly to FIG. 6, dashed signals in FIG. 7 indicate signals from the previous read cycle. In FIG. 7, signal QL2 is activated or makes a transition to HIGH at 702. This transition is before the transitions of QL0 and QL1 at 704 and 705 and after the transitions of QL0 and QL1 at 700 and 701. By this time (at 702), the previous bits D0–D3 have already passed to nodes 342 0–3 by the transitions of QL0 and QL1 at 700 and 701. Thus, by properly activating signals QL0–QL3 in latency five, output circuit 112-0 properly processes bits D0–D3 in all read cycles FIGS. 8A–D are schematic diagrams of input selects 320 0–3 of FIG. 3. Each of the input selects 320 0–3 of FIGS. 8A–D has a plurality of multiplexors 810 0–3. For simplicity, reference numbers of multiplexors between different input selects 320 0–3 are the same. In FIG. 8A, each of the multiplexors 810 0–3 has an input connected to one of the corresponding input lines 326, which receives one of the bits of data D0–D3. Multiplexors 810 0–3 also have a plurality of outputs connected to node 812. A storage element 814 has a first storage node connected to the outputs of multiplexors 810 0–3 at node 812 and a second storage node connected to one of the nodes 322 0–3. Each of the multiplexors 810 0–3 is controlled by one of the signals CA0–CA3 received on lines 328.

Figure 8B:
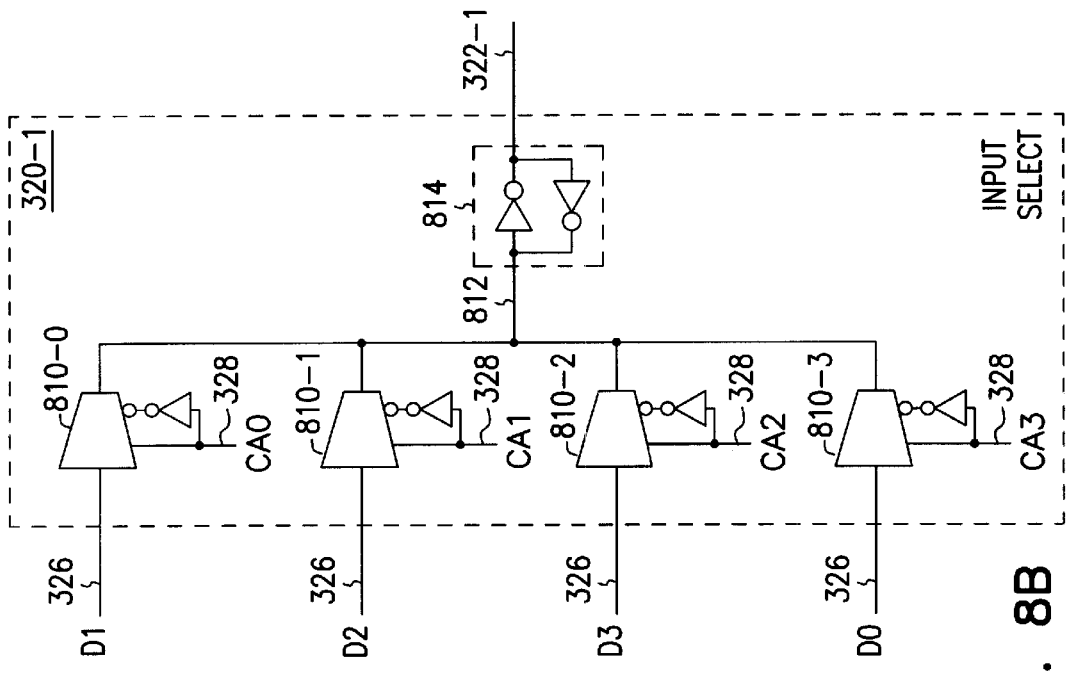
FIGS. 8A–D are schematic diagrams of input select circuits of FIG. 3.
Figure 8A:
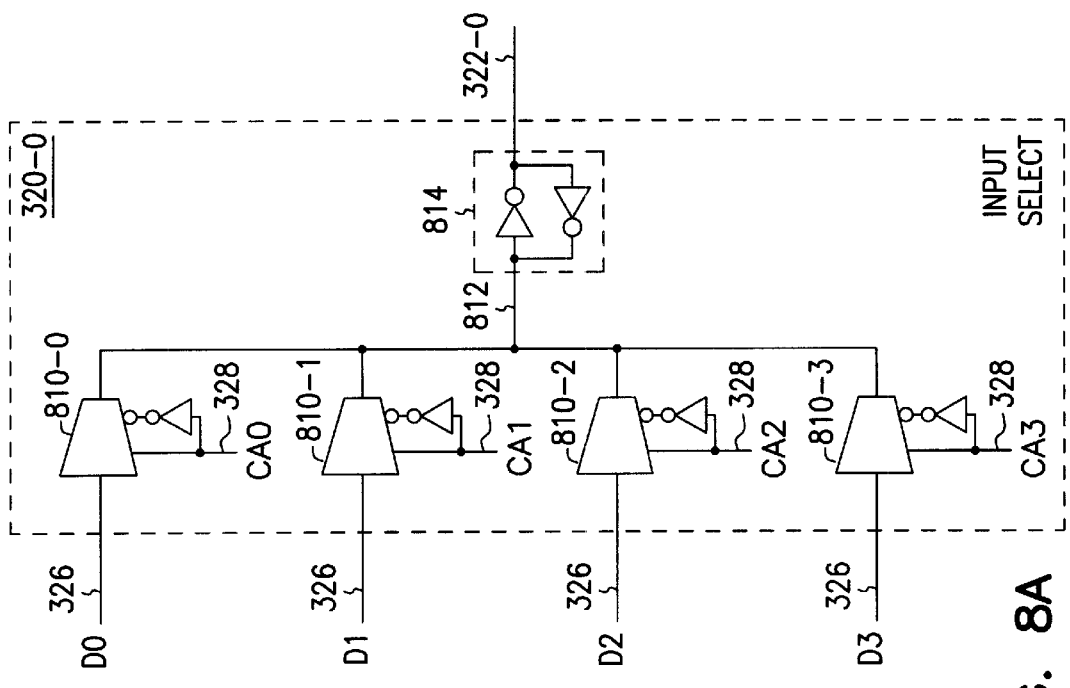
Figures 8C, 8D:
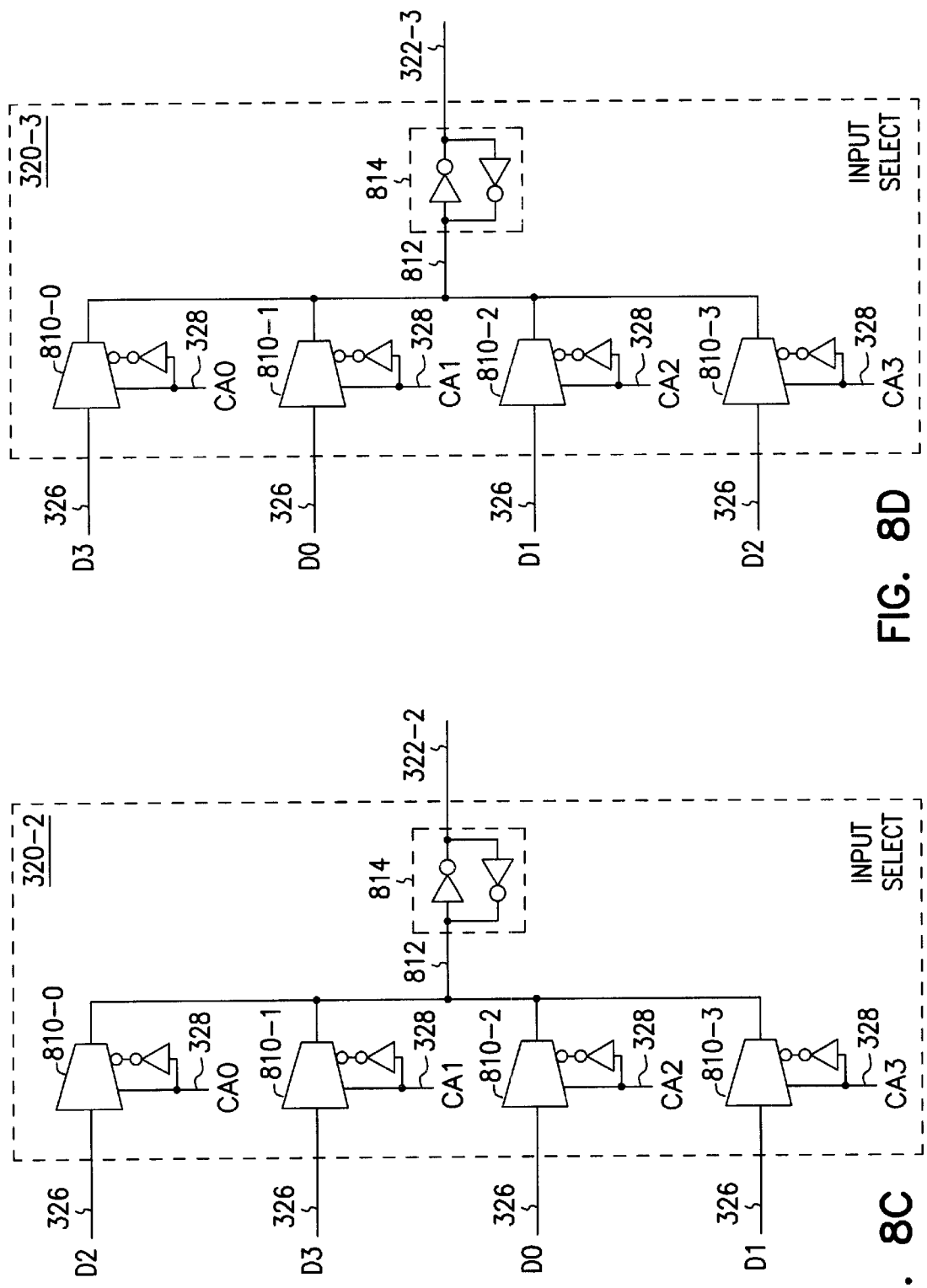

In FIGS. 8B–D, input selects 310 1–3 have the same arrangement as that of input select 310-0 of FIG. 8A. However, inputs 326 of input selects 310 1–3 receive bits of data D0–D3 in different orders. In FIG. 8A, input 326-0, 326-1, 3262 and 326-3 receive D0, D1, D2 and D3, in this order, respectively. In FIG. 8B, the order D0–D3 received by input 326-0, 326-1, 326-2 and 326-3 is D1, D2, D3 and D0, respectively. In FIG. 8C, the order of signals D0–D3 received by input 326-0, 326-1, 326-2 and 326-3 is D2, D3, D1 and D0, respectively. FIG. 8D, the order of signals D0–D3 received by input 326-0, 326-1, 326-2 and 326-3 is D3, D0, D1 and D2, respectively.

The operation of input selects 320 0–3 of FIGS. 8A–D are the same. When one of the CA 0–3 signals is activated, the corresponding multiplexors controlled by that activated CA signal passes one of the bits D0–D3 from one of the nodes 326 to node 812 and to one of the nodes 322 0–3. For example, in FIG. 8A, if CA0 is activated or transition HIGH, multiplexor 810-0 passes bit D0 from node 326 to nodes 812 and to node 322-0. If CA1 is activated, bit D1 is passed to node 322-0. Similarly, if CA2 or CA3 are activated bits D2 or D3 is passed to node 322-0.

Only one of the signals CA 0–3 is activated at a time. The order of activation of signals CA 0–3 is based on logic values of address bits A1 and A0. If A1A0 is 00, then CA0 is activated; if A1A0 is 01, then CA1 is activated; if A1A0 is 10, then CA2 is activated; and if A1A0 is 11, then CA3 is activated. These orders are consistent with the orders of selection of data bits D0–D3 of FIG. 3. For example, if A1A0 is 10, then CA2 is activated. In FIG. 8A, multiplexor 810-2 controlled by signal CA2 passes D2 to node 322-0. Bit D2 is the first bit in the order. In FIG. 8B, multiplexor 810-2, also controlled by signal CA2, passes D3 to node 322-1. Bit D3 is the second bit in the order. Similarly, multiplexors 810-2 of FIGS. 8C and 8D pass bits D0 and D1 to node 322-2 and 322-3 respectively. Thus, when A1A0 is 10, signal CA2 is activated, which causes input selects 320 0–3 to select bits D2, D3, D1 and D0. This matches the selection of input selects 320 0–3 of FIG. 3.

Figure 9:
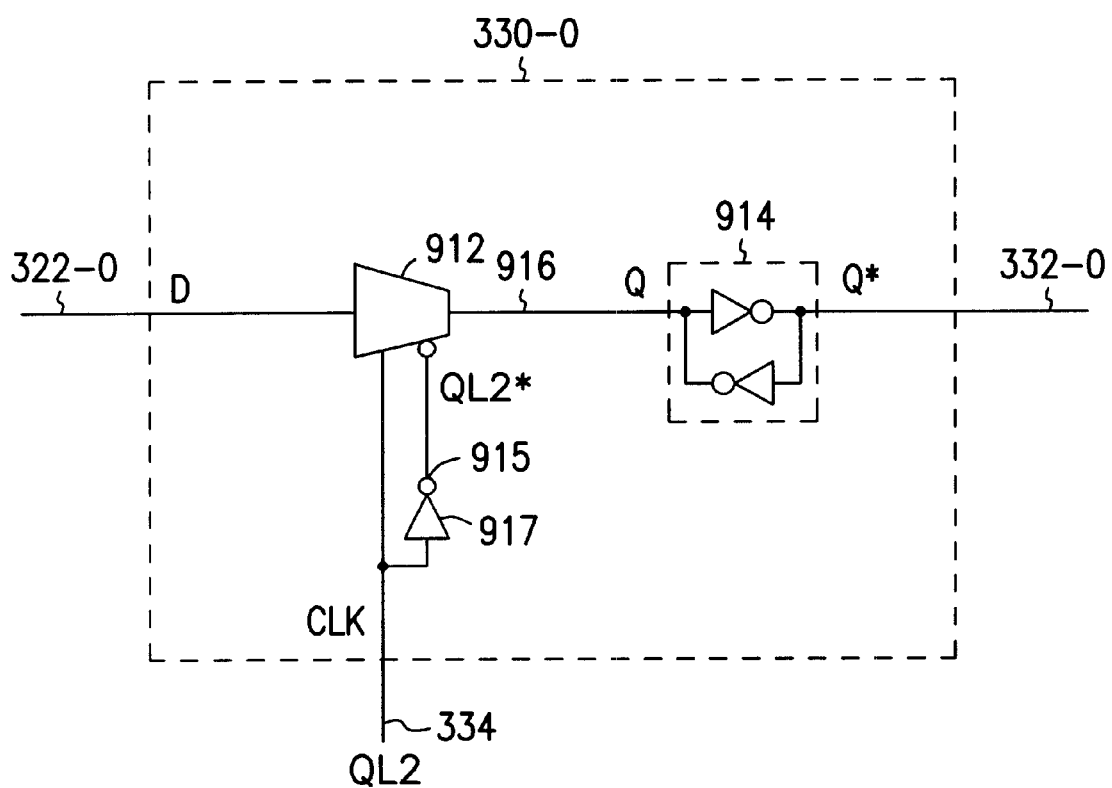
FIG. 9 is a schematic diagram of a latch of the output circuit of FIG. 3.

FIG. 9 is a schematic diagram of first latch 330-0 output path 310-0 of FIG. 3. Latch 330-0 has multiplexor 912 connected to a storage element 914 via line 916. Multiplexor 912 includes an input D connected to node 322-0 and an output connected to node 916. Multiplexor 912 connects to line 334 at its clock or CLK terminal to receive the QL2 signal. Multiplexor 912 also connects to line 915, which connects to an output of an inverter 917. Inverter 917 also receives the QL2 signal on line 334 and generates a compliment signal QL2* on line 915. A storage element 914 has a first storage node Q connected to node 916 and second storage node Q* connected to line 332-0. FIG. 9 shows only first latch 330-0 of output path 310-0, however, other first latches 330 1–3 and second latches 340 0–3 of other output paths 310 1–3 are the same as latch 330-0 of FIG. 9. Thus, the operations of other first and second latches of FIG. 3 is the same as the operation of latch 330-0 of FIG. 9.

Referring to FIG. 9, when signal QL2 is not activated, multiplexor 912 is closed, preventing data or signal on line 322 to pass through multiplexor 912. When signal QL2 is activated, multiplexor 912 is opened, allowing data or signal on line 322-0 to pass through the multiplexor to lines 916 and 332-0. A signal is activated when it changes from one signal level to another signal level. In this case, the signal QL2 is activated when it makes a transition (or switches) from a low signal level (LOW) to a high signal level (HIGH). Thus, in FIG. 9, when QL2 switches from LOW to HIGH, data on line 322-0 is passed to line 332-0. Similarly, In FIG. 3, when QL0 and QL1 are activated, data on lines 332 0–3 are passed through latches 340 0–3 to lines 342 0–3.

Figure 10:
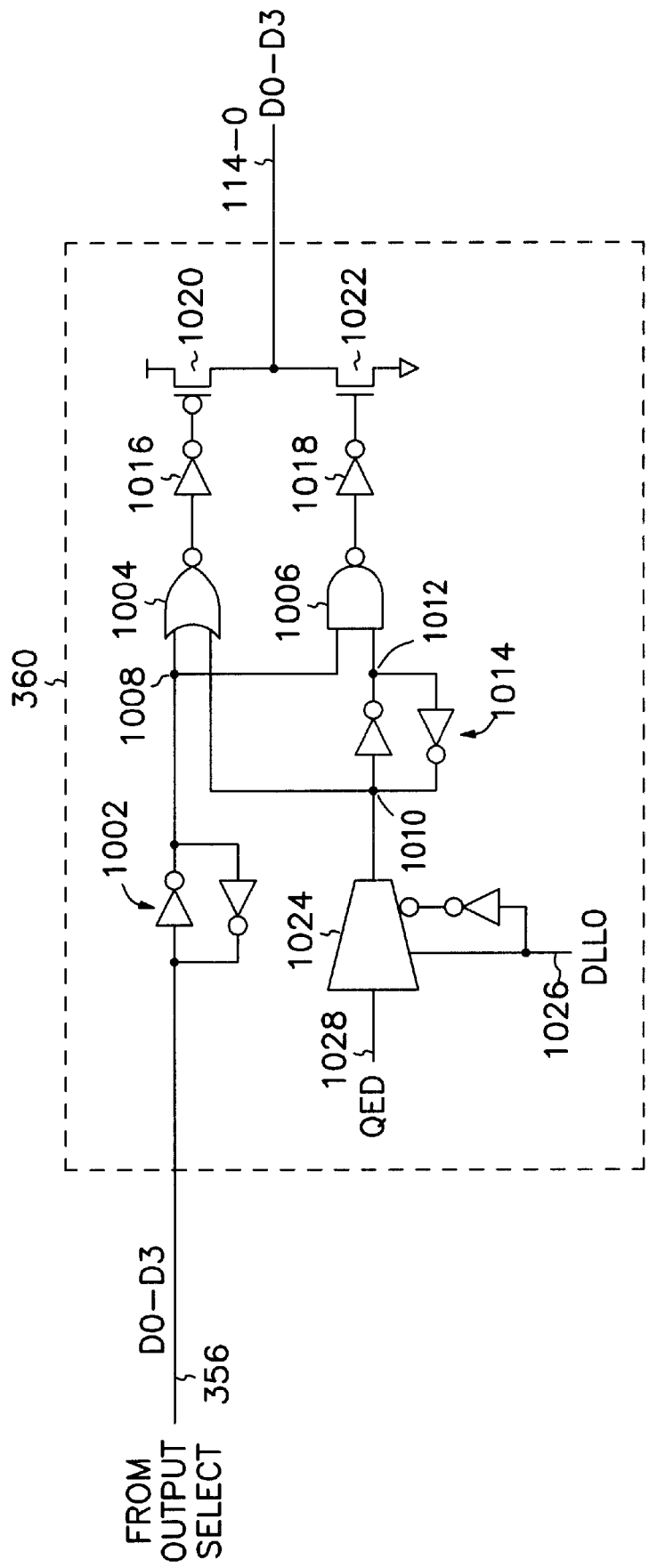
FIG. 10 is a schematic diagram of an output stage of FIG. 3.

FIG. 10 is a schematic diagram of output stage 360 of FIG. 3. Output stage 360 includes a storage element 1002 connected to node 356 to receive data bits D0–D3 from output select 350. Storage element 1002 also connects to a first input of a NOR gate 1004 and a first input of an NAND gate 1006 at node 1008. A second input of NOR gate 1004 connects to a storage element 1014 at node 1010. A second input of NAND gate connects storage element 1014 at node 1012. The output of NOR gate 1004 connects to a gate of a p-channel transistor 1020 through an inverter 1016. The output of NAND gate 1006 connects to a gate of an n-channel transistor 1022 through an inverter 1018. Transistor 1020 also has a source, which connects to a power supply and a drain, which connects to data pad 114-0. Transistors 1022 also has a drain, which connects to ground, and a source, which connects to data pad 114-0. Signal DLL0 is provided at node 1026, which connects to a multiplexor 1024. Multiplexor 1024 has an input at node 1028 to receive signal QED, and an output connected to node 1010.

In operation, storage element 1002 receives data bits D0–D3 in series and passes them to node 1008, which is the first input of NOR gate 1004 and NAND gate 1006. At a certain time, for example, at time TB shown in FIG. 4, DLL0 makes a transition to HIGH. This cause multiplexor 1024 to pass signal QED to node 1010 and 1012. NOR gate 1004 and NAND gate 1006 determine the combination of QED signal at nodes 1010 and 1012 with the signal at node 1008 to either turn on transistor 1020 or transistor 1022. If transistor 1020 is on, node 114-0 is pulled to the power supply (HIGH). If transistor 1022 is on, node 114-0 is pulled to ground (LOW). A HIGH or LOW at node 114-0 represents one of the data D0–D3, which is an inverse of one of the corresponding compliment data bits D0–D3 received from lines 326.

Figure 11:
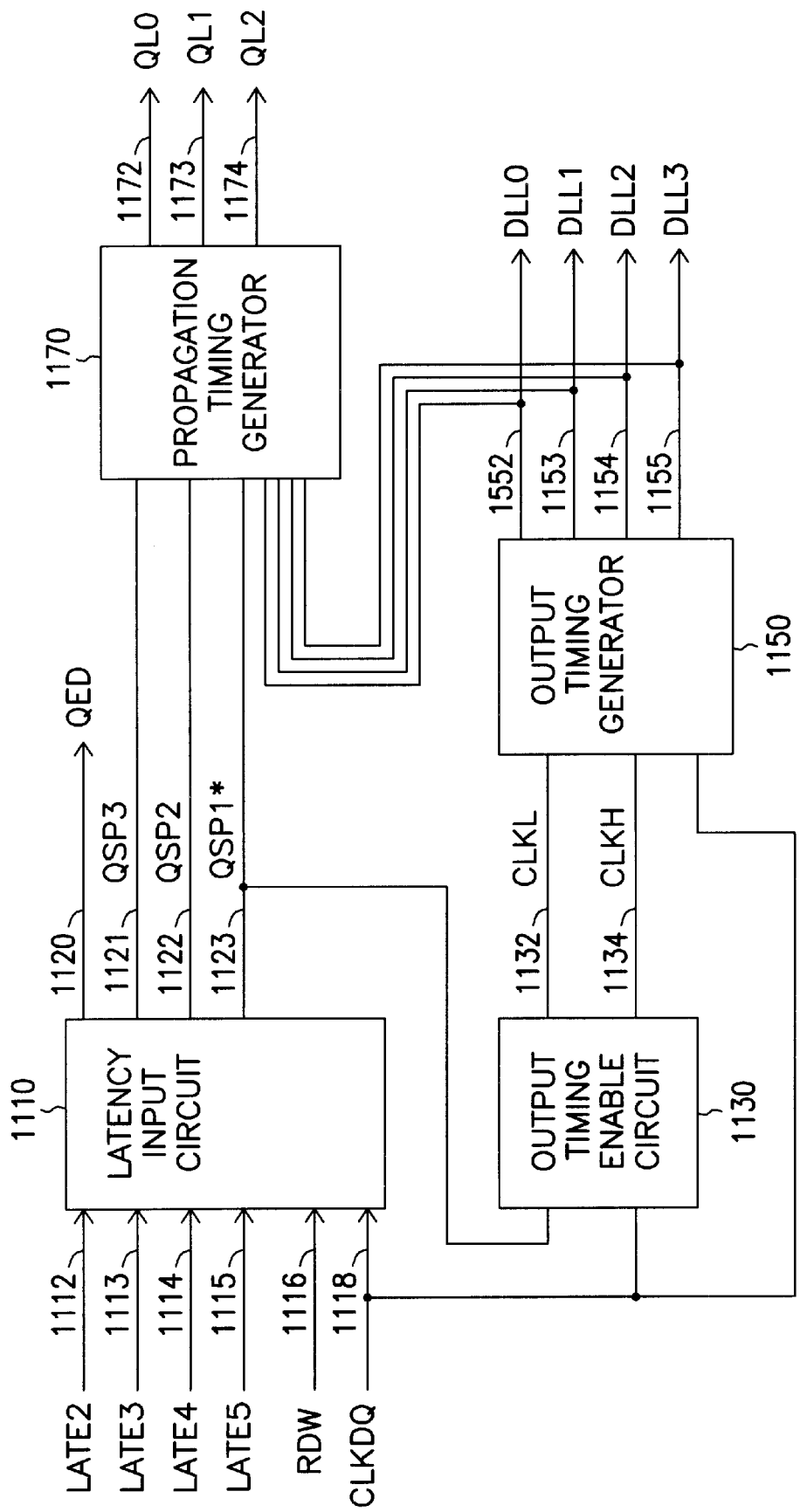
FIG. 11 is a block diagram of an output controller of FIG. 1.

FIG. 11 is a block diagram of output controller 117 of FIG. 1. Output controller 117 include a latency input circuit 1110, which receives a plurality of latency signals LATE2–LATE5 on line 1112–1115, a read signal RDW on line 1116 and a delay locked loop clock signal CLKDQ on line 1118. Latency input circuit 1110 has a plurality of output at lines 1120–1123 to provides a plurality of signals QED, QSP2, QSP3, and QSP1*. An output timing enable circuit 1130 connects to input latency 1110 through lines 1118 and 1123 to receive the CLKDQ ande QSP1* signals. Output timing enable circuit 1130 generates a first enable signal CLKL on line 1132 and a second enable signal CLKH on line 1334. An output timing generator 1150 connects to output timing enable circuit 1130 via lines 1132 and 1134 to receive signals CLKL and CLKH. Signals CLKL and CLKH enable output timing generator 1150 to generate timing signals DLL0–DLL3 on lines 1552–1155. DLL0–DLL3 signals are used to control output select 350 as described in FIG. 3. A propagation control signal generator 1170 connects to latency input circuit 1110 via lines 1121–1123 and to output timing circuit 1150 via lines 1152–1155 to receive the QSP2, QSP3, QSP1*, and DLL0–DLL3 signals. Propagation control signal generator 1170 generates the QL0–QL2 signals on lines 1172–1174. The QL0–QL2 are used to activate first and second latches 330 0–3 and 340 0–3 of FIG. 3.

In the following description, a "flip flop" refers to a commonly used circuit component, which is widely understood by one of ordinary skill in the art. A flip flop in the following description is a positive-edge-triggered flip flop. However, with the benefit of reading this invention disclosure, one of ordinary skill in the art can easily use negative-edge-triggered flip flops or other types similar components to achieve the same result. In addition, in the following description, a "latch" or a "pass through latch" also refers to common circuit components. A latch is used to pass data or signal from its input to its output. Latches described in the following description can be similar to latch 330-0 of FIG. 9.

Figure 12:
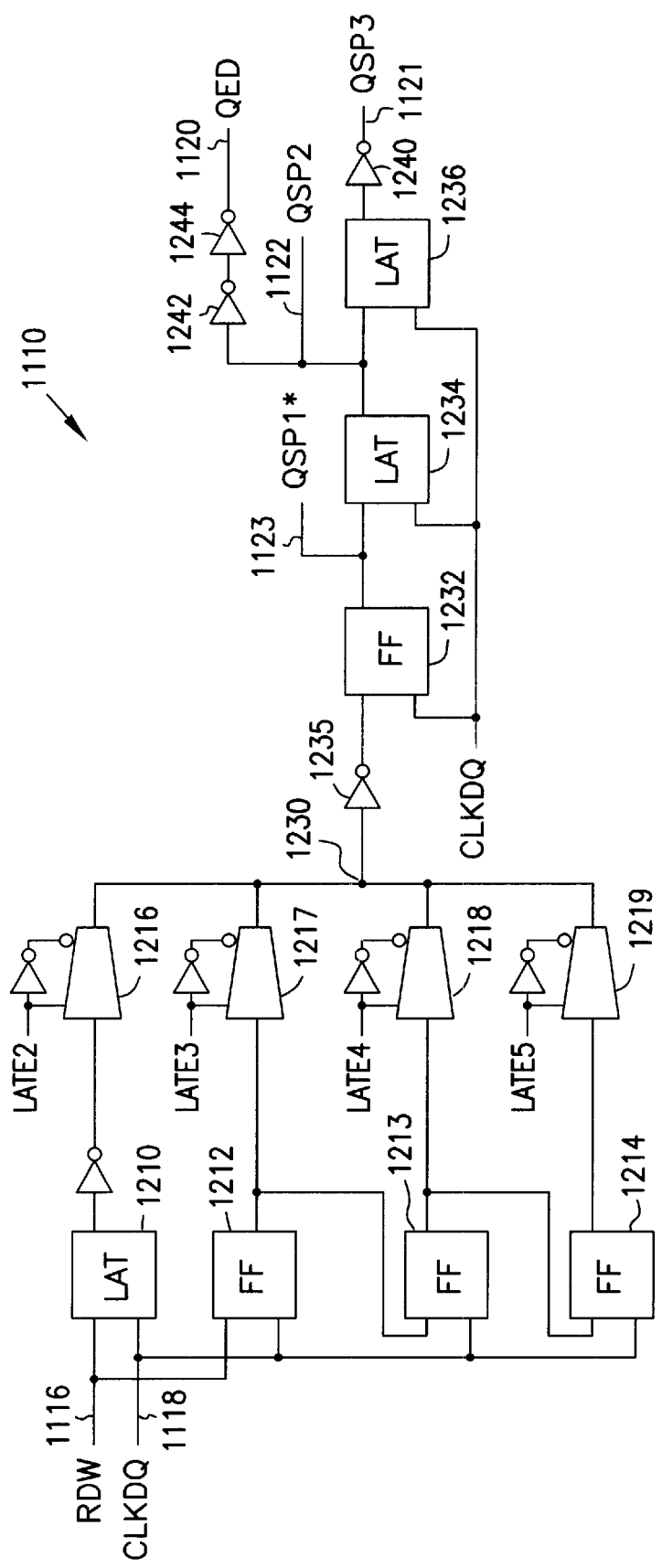
FIG. 12 is a schematic diagram of a latency input circuit of FIG. 11.

FIG. 12 is a schematic diagram of latency input circuit 1110 of FIG. 11. Latency input circuit 1110 has a pass through latch (LAT) 1210 and a plurality of flip flops (FF) 1212–1214. Latch 1210 and flip flops 1212–1214 receive signal CLKDQ on line 1118. Latch 1210 and FF 1212 receive signal RDW on line 1116. A plurality of multiplexors 1216–1219 receive the LATE2–LATE5 on lines 1112–1115 to pass the RDW signal to node 1230. A flip flop 1232 has an input connected to node 1230 through an inverter 1235. An output of flip flop 1232 connects to an input of a latch 1234 at node 1123, which provides signal QSP1*. Latch 1234 has an output connected to an input of a latch 1236 at node 1122, which provides signal QSP2. Node 1122 also provides the QED signal through series connected inverters 1242 and 1244. An output of latch 1236 connects to node 1121 through an inverter 1240 to provide signal QSP3. The clock inputs of flip flop 1232 and latches 1234 and 1236 also receive signal CLKDQ.

RDW is a signal generated by memory control 116 when a combination of input signals CS*, RAS* and WE* is valid. The LATE2–LATE5 signals are also generated by control circuit 116 based on the latency, which is programmed in memory device 100. The CLKDQ signal is provided by a delay locked loop of memory device 100. The delay locked loop is not shown because it is a conventional circuit, which can be one of many widely known types of delay locked loops in the art.

In FIG. 12, signals QSP1*, QSP2 and QSP3 are generated by the propagation of signal RDW through latch 1210 or one of the flip flops 1212–1214. If the latency setting is two, then RDW passes through latch 1216 to node 1230. If the latency setting is either three, four, or five, then the RDW signal passes to one, two or three of the flip flops 1212–1214. The signals LATE2–LATE5 control the passage of the RDW signal to node 1230 through multiplexors 1216–1219.

Figure 16:
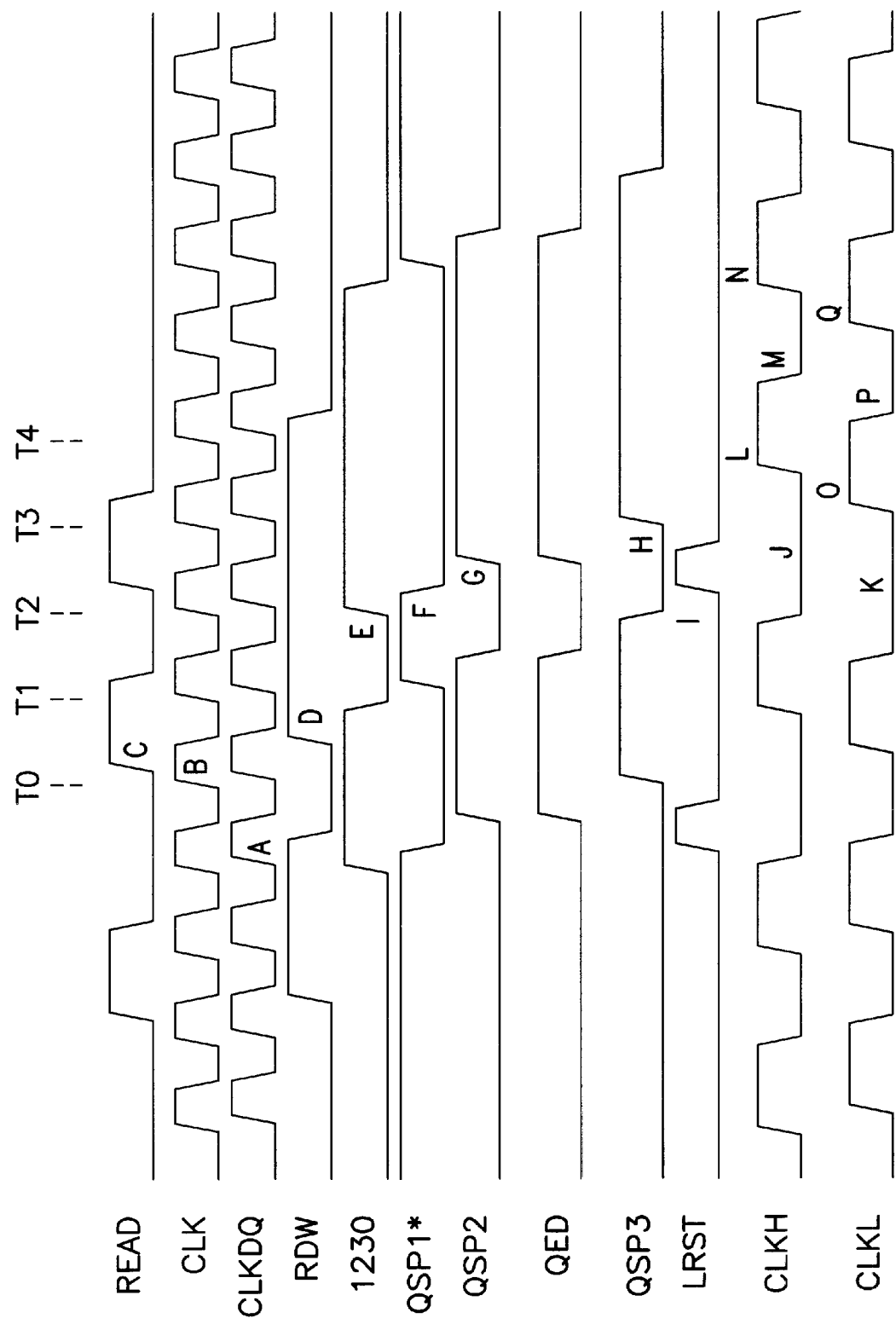
FIG. 16 is a timing diagram of the operation of FIGS. 12–13.

The operation of latency input circuit 1110 of FIG. 12 is described herein in conjunction with a timing diagram of FIG. 16. For the purpose of illustrating the invention, it is assumed that memory device 100 is programmed or set at a latency of four, thus, only signal LATE4 is activated. In this case, a first bit of data will occur at data pad 114-0 four clock cycles after a read command is valid. In FIG. 16, CLKDQ and CLK signals make transitions to HIGH at A and B in anticipation of a read operation. At time T0, a read command READ makes a transitions to HIGH (at C), indicating a beginning of new read operation. Subsequently, at D, signal RDW switches HIGH. In FIG. 12, after signal RDW propagating through flip flops 1212 and 1213, LATE4 signal activates multiplexor 1218 to pass signal RDW to node 1230 of FIG. 12. Since the RDW signal is HIGH, the signal at node 1230 is also HIGH. In FIG. 16, node 1230 is switches to HIGH at E. A HIGH at node 1230 forces a LOW to the output of inverter 1235. The signal at the output of inverter 1235 is also the signal at the input of flip flop 1232. Since the CLKDQ is HIGH, flip flop 1232 causes the signal at its output on node 1123 LOW, which represents the QSP1* signal. In FIG. 16, QSP1* switches to LOW at F. Subsequently, the signal at node 1123 propagates through latches 1234 to node 1122 then through latch 1236 to node 1121. The signal at node 1122 is presented by signal QSP2 and the signal at node 1121 is presented by signal QSP3. In FIG. 16, when the signal QSP1* is LOW at node 1123, it causes signal QSP2 to switch to HIGH at G and signal QSP3 to switch to HIGH at H. In addition, signal QED at node 1120 also follows signal QSP2 through inverters 1242 and 1244. Signals QSP1*, QSP2 and QSP3 are used as input signals to other circuits as are shown in FIG. 11. Signal QED is used as a strobe signal to output data as shown in FIG. 10.

Figure 13:
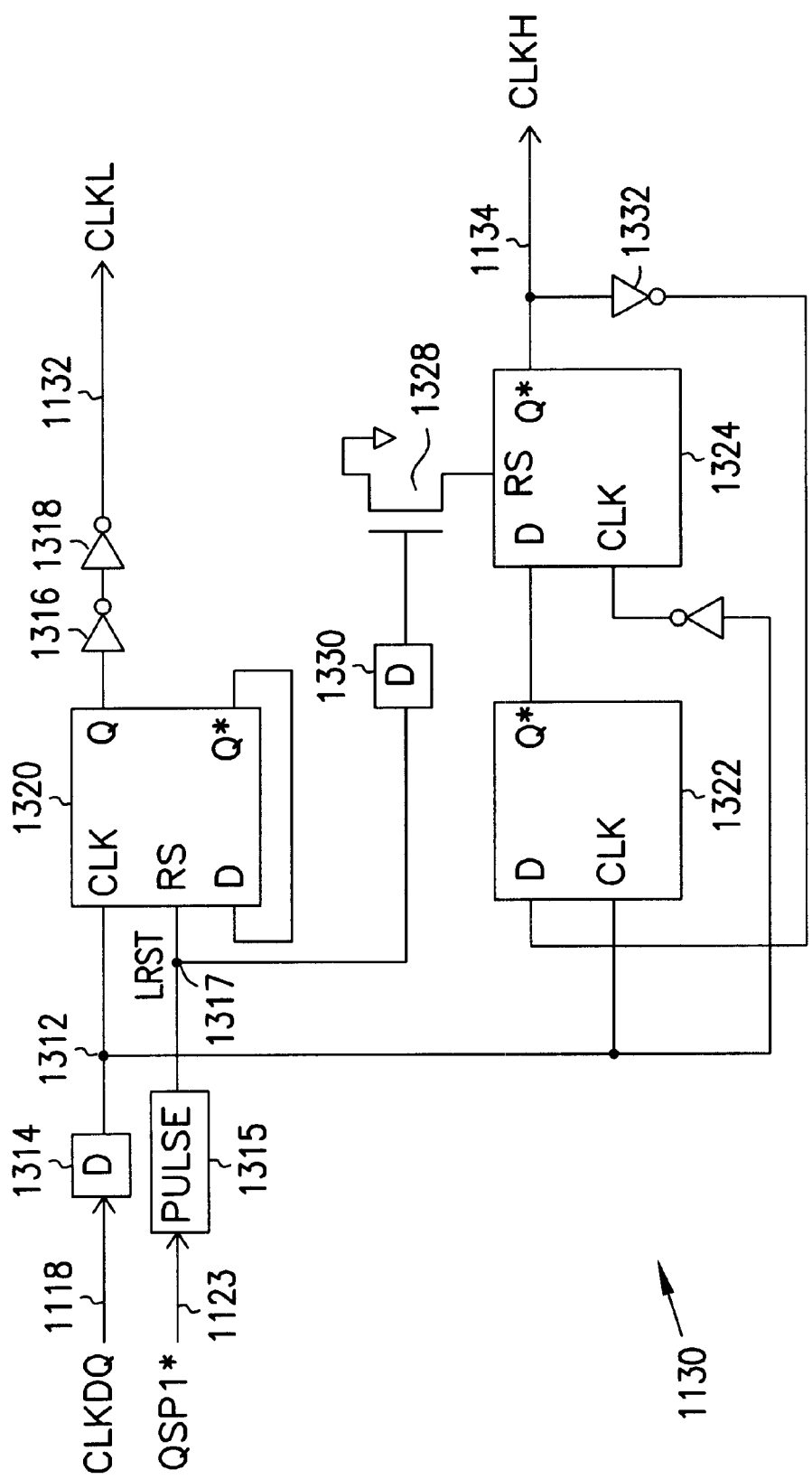
FIG. 13 a schematic diagram of an output timing enable circuit of FIG. 11.

FIG. 13 is a schematic diagram of output timing enable circuit 1130 of FIG. 11. Output timing enable circuit 1130 has a pulse circuit (PULSE) 1315 connected to line 1123 to receive signal QSP1* to generate a latch reset signal LRST at node 1317. A flip flop 1320 has a reset RS input, a clock CLK input, an data input D, and complimentary output Q and Q*. The RS input connects to node 1317 to receive the LRST signal. The CLK input connects to a delay 1314 at node 1312 to receive a delay version of the CLKDQ signal. Input D and output Q* and are connected together. Output Q provides signal CLKL on line 1132 through inverters 1316 and 1318. A series connected latches 1322 and 1324 receive the delayed version of the CLKDQ signal on line 1312 and provide signal CLKH on line 1134. Node 1134 connect to input D via a feedback loop comprising inverter 1332. A transistor 1328 has a gate connected to a delay 1330 to receive a delay version of the LRST signal. Transistor 1326 also has a source connected to ground, and a drain connected to a reset RS terminal of latch 1324. When the LRST signal is activated (HIGH), it turns transistor 1328 on and resets latch 1324. When latch 1324 is reset, it forces signal CLKH node 1134 LOW. The LRST signal also resets latch 1320 in the same manner. When the LRST signal is activated HIGH, it forces signal CLKL on node 1132 LOW.

In FIG. 13, CLKH and CLKL signals are generated based on signal CLKDQ signal. Enable signal CLKL and CLKH are used to activate signal DLL0–DLL3, which in turns enable data to be transfer to data pads 114 0–N during a read operation. To ensure that data is properly transferred in each read operation, the LRST signal is activated each time a new read command is received. The LRST resets signals CLKH and CLKL to ensure that data is transferred properly.

Referring again to FIG. 16, when QSP1* switches to LOW at F, as a result of a new read operation indicated by RDW being HIGH at D, pulse circuit generates a pulse LRST at I. When signal LRST is activated, it resets the CLKH and CLKL signals to LOW, indicated at J and K. After resetting LOW at J and K, CLKH and CLKL signals are affected by only CLKDQ signal until another reset. For example, the CLKH resumes its normal transitions at L, M and N; and the CLKL signal resumes its normal transitions at O, P and Q. As shown in FIG. 16, CLKH and CLKL have different phases. In other words, CLKH and CLKL are not synchronized. CLKH and CLKL signals are used to enable output timing generator 1150 of FIG. 14.

Figure 14:
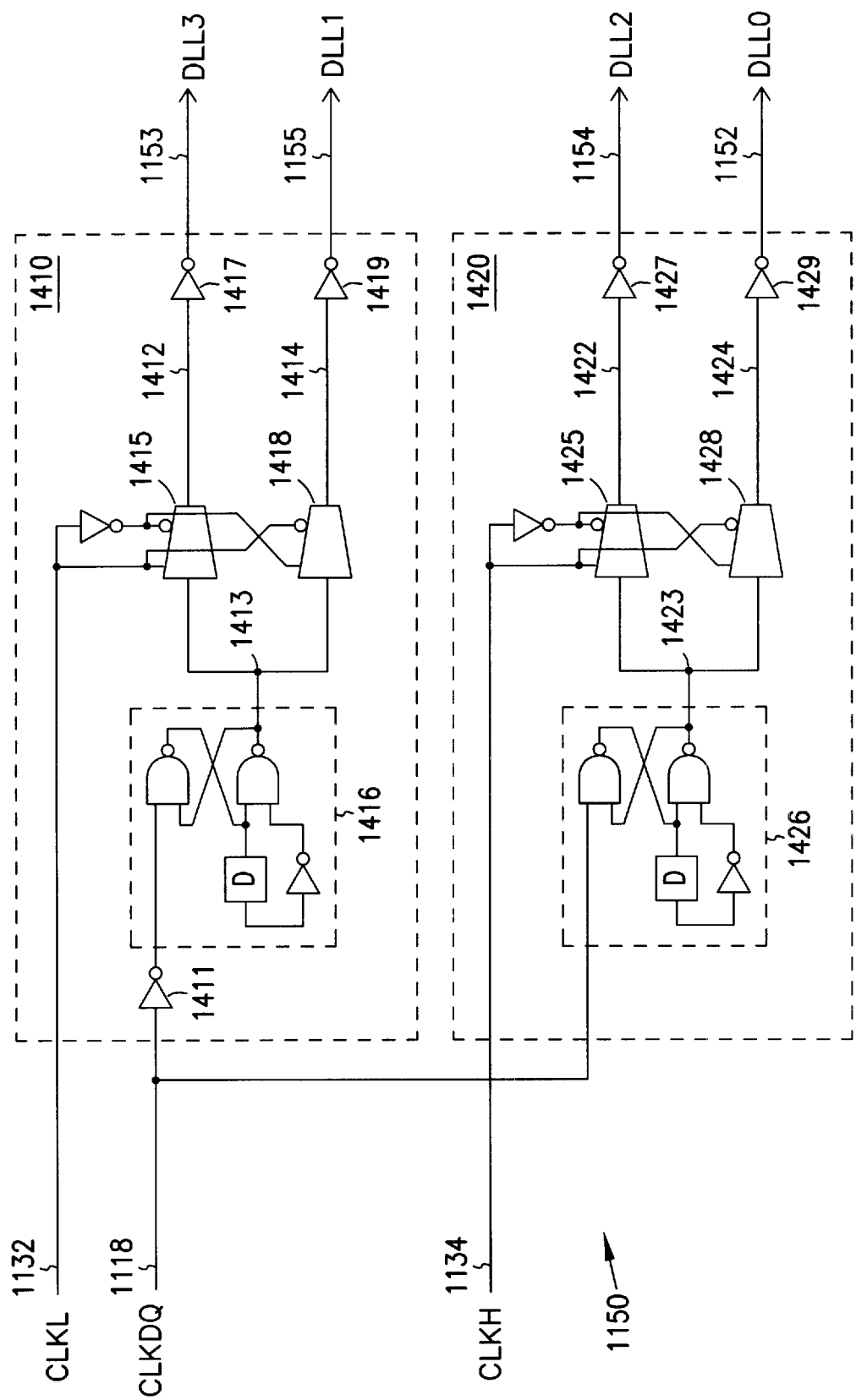
FIG. 14 is a schematic diagram of an output timing generator of FIG. 11.

FIGS. 14 is a schematic diagram of output timing generator 1150 of FIG. 11. Output timing generator 1150 has a first and second timing circuits 1410 and 1420. Both circuits 1410 and 1420 are construct the same and receive the same CLKDQ signal on line 1118. Circuit 1410 has a pulse generator 1416, which receives an inverse of the CLKDQ through an inverter 1411. Pulse generator 1416 generates an output signal at node 1413. The signal at node 1413 is passed to lines 1153 or 1155 representing signal DLL1 or DLL3. The passage from node 1413 to line 1153 or 1155 is controlled by multiplexors 1415 or 1418. Multiplexors 1415 and 1418 is controlled by signal CLKL signal at node 1132.

Circuit 1420 has a pulse generator 1426, which receives the CLKDQ through an inverter 1411 at its input at node 1429. Pulse generator 1426 generates an output signal at node 1423. The signal at node 1413 is passed to lines 1153 or 1155 representing signal DLL0 or DLL2. The passage from node 1423 to line 1154 or 1152 is controlled by multiplexors 1425 or 1428. Multiplexors 1425 and 1428 is controlled by the signal CLKH at node 1134.

In general, pulse generators 1416 and 1426 receive the CLKDQ signal and generates an output signal on nodes 1413 and 1423. The signal on node 1413 is passed through multiplexors 1415 or 1418 to become signals DLL1 or DLL3. Thus, depending on which phase of the CLKL signal, either the DLL1 or DLL3 is generated. In other words, DLL1 and DLL3 are activated at alternate phases of the CLKL signal. Similarly, the signal on node 1423 is passed through multiplexors 1425 or 1428 to become signals DLL0 or DLL2. Thus, depending on which phase of the CLKH signal, either the DLL0 or DLL2 is generated. In other words, DLL0 and DLL2 are activated at alternate phases of the CLKH signal. The CLKH and CLKL signals do not have the same phase. This enables them to properly activate signal DLL0–DLL3 such that the order of data bits D0–D3 can be properly output to data pad 114-0.

Figure 17:
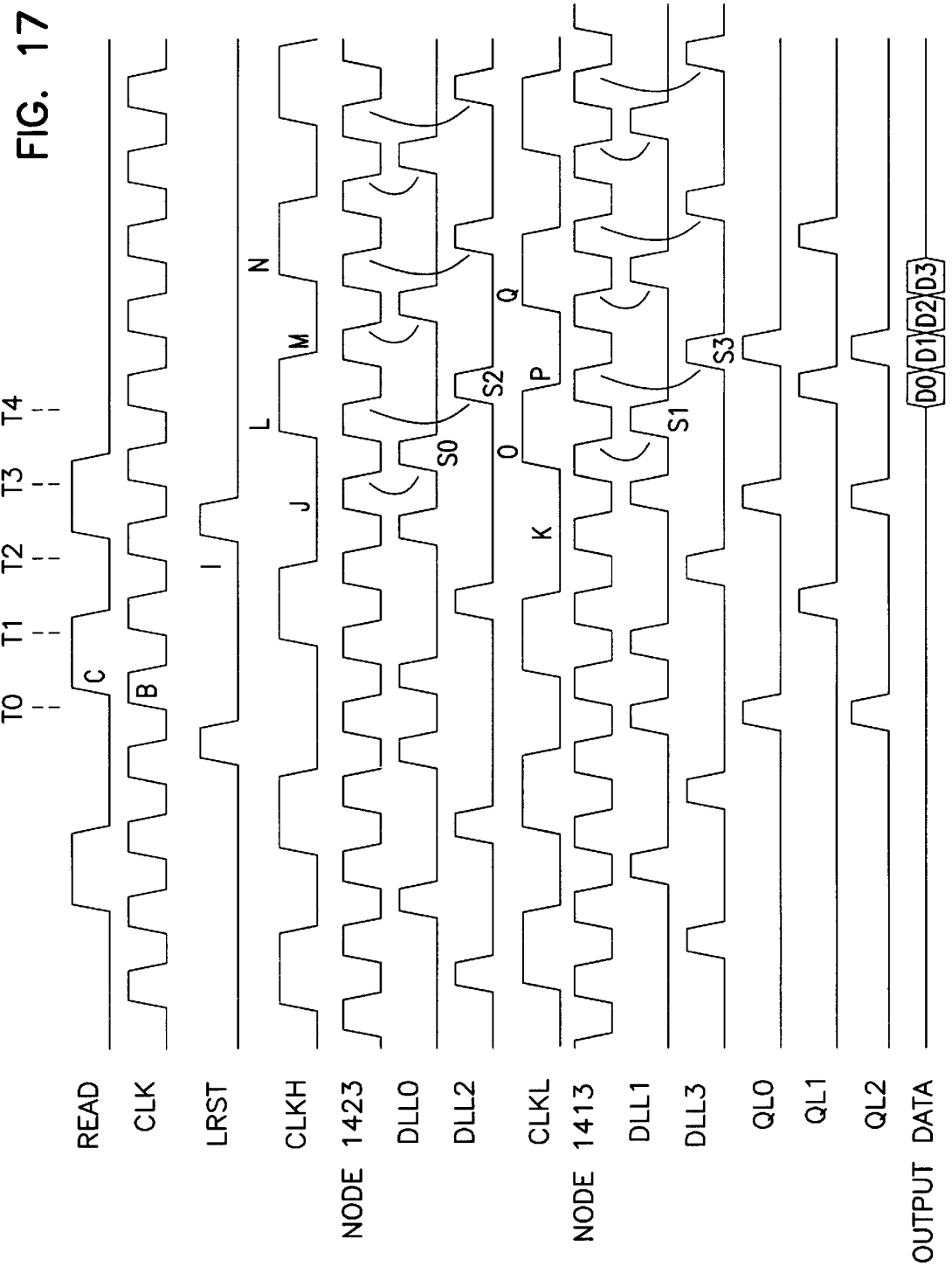
FIG. 17 is a timing diagram of the operation of FIGS. 14–15.

FIG. 17 is a timing diagram the operation of FIG. 14. In FIG. 17, the signals at nodes 1423 and 1413 represent the signals at outputs of pulse generators 1416 and 1426 at nodes 1423 and 1413 of FIG. 14. Signals CLK, READ, LRST, CLKH and CLKL are the same signals from FIG. 16. When the CLKH signal is LOW at J, it activates multiplexor 1428, allowing the signal at node 1423 to pass through inverter 1429. The signal at node 1423 is LOW at this time, thus, signal at the output of inverter 1429, or DLL0 signal, is HIGH. In FIG. 17, DLL0 is activated HIGH at S0. When signal CLKH is HIGH at L, it activates multiplexor 1425, allowing the signal at node 1423 to pass through to inverter 1427. The signal at node 1413 is LOW at this time, thus, the signal at output of inverter 1427, or DLL2 signal, is HIGH. In FIG. 17, DLL2 is activated HIGH at S2. In summary, when signal CLKH makes a transition, it activates timing signal DLL0, when signal CLKH makes another transition, it activates timing signal DLL2. For example, in FIG. 17, the timing signals DLL0 and DLL2 are activated during different phases of enable signal CLKH. DLL0 is activated at one phase of signal CLKH (when signal CLKH is LOW); and DLL2 is activated at another phase of signal CLKH (when signal CLKH is HIGH). In other words, timing signals DLL0 and DLL2 are activated following a falling edge and a rising edge of enable signal CLKH.

Similarly, when the CLKL signal is LOW at K, it activates multiplexor 1418, allowing the signal at node 1413 to pass through to inverter 1419. The signal at node 1413 is LOW at this time, thus, signal at the output of inverter 1419, or DLL1 signal, is HIGH. In FIG. 17, DLL1 is activated HIGH at S1. When signal CLKL is HIGH at O, it activates multiplexor 1415, allowing the signal at node 1413 to pass through to inverter 1417. The signal at node 1413 is LOW at this time, thus, the signal at output of inverter 1417, or DLL3 signal, is HIGH. In FIG. 17, DLL3 is activated HIGH at S3. In summary, when signal CLKL makes a transition, it activates timing signal DLL1, when signal CLKL makes another transition, it activates timing signal DLL3. In other words, the timing signals DLL1 and DLL3 are activated during different phases of enable signal CLKL. For example, In FIG. 17, DLL1 is activated at one phase of signal CLKL (when signal CLKL is HIGH); and DLL3 is activated at another phase of signal CLKL (when signal CLKL is LOW). In other words, timing signals DLL1 and DLL3 are activated following a falling edge and a rising edge of enable signal CLKL.

In FIG. 17, OUTPUT DATA indicates bits of data output at data pad 114-0. In latency of four, the first bit of data appear at time T4. For the purpose of describing the invention, it is assumed that data output at data pad 114-0 follows a transfer order of D0, D1, D2 and D3. Thus, D0 and D2 are referred to as even bits of data, and D1 and D3 are referred to as odd bits of data. In general, in a series of four bits of data output at data pad 114-0, even bits of data are the first and third bits. Odd bits of data are the second and fourth bits of data. In this case, even bits D0 and D2 are output after timing signals DLL0 and DLL2 are activated or make transition HIGH at different phases of enable signal CLKH. In other words, bits D0 and D2 are output at alternate phases of enable signal CLKH. Similarly, D1 and D3 are output after timing signals DLL1 and DLL3 are activated or make transition HIGH at different phases of enable signal CLKL. In other words, bits D1 and D3 are output at alternate phases of enable signal CLKL.

Figure 15:
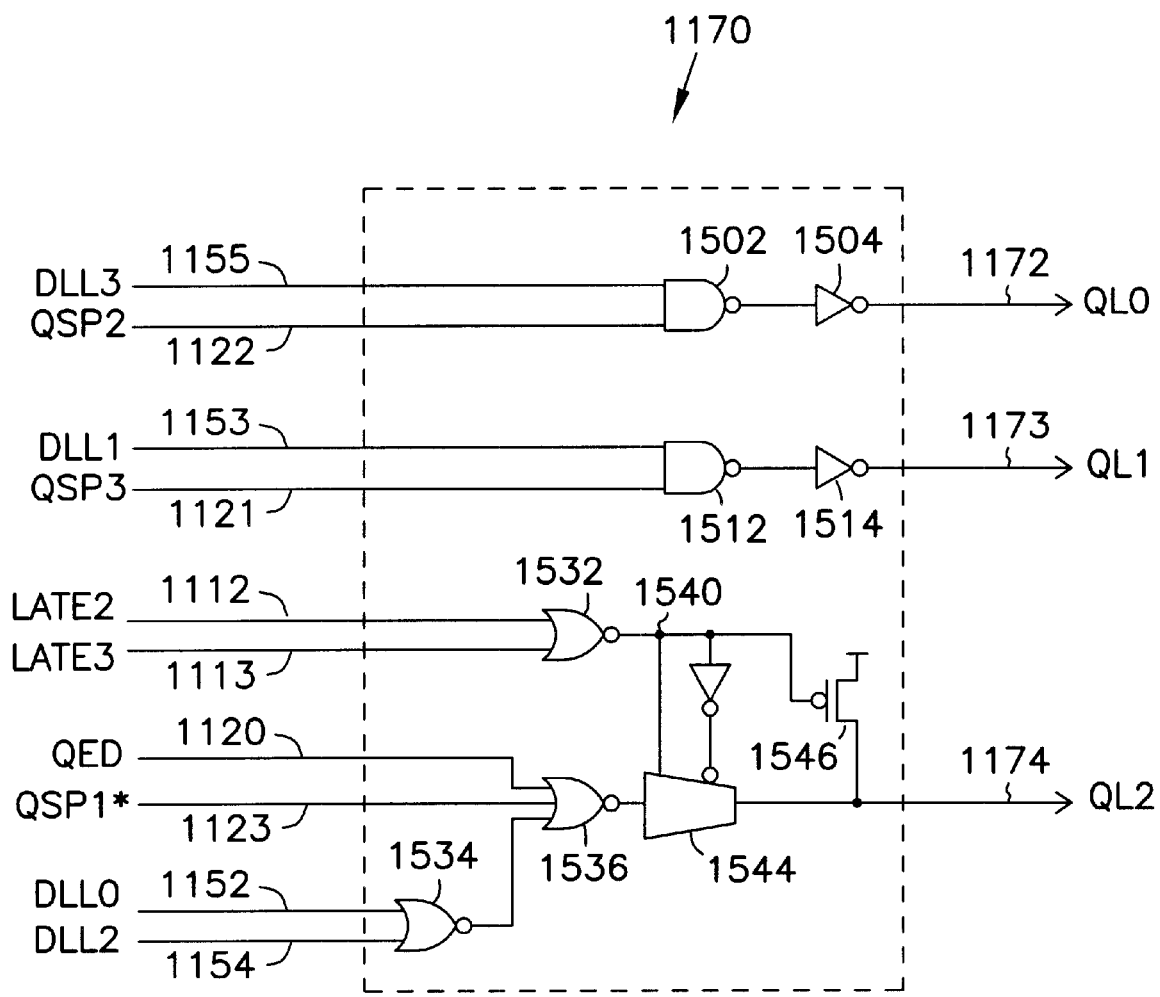
FIG. 15 is a schematic diagram of a propagation control signal generator of FIG. 11.

FIG. 15 is a schematic diagram of propagation control signal generator 1170 of FIG. 11. Propagation control signal generator 1170 has a NOR gate 1502 to receive the DLL3 and QSP2 signals on nodes 1155 and 1122. An output of NAND gate 1502 connects to an inverter 1504, which has an output connected to node 1172 to provide QL0 signal. In a similar arrangement, a NAND gate 1512 receives the DLL1 and QSP3 at node 1153 and 1121. The output of NAND gate 1512 connects to an inverter 1514, which has an output connected to node 1173 to provide QL1 signal. Propagation control signal generator 1170 also receives other signals such as the LATE2, LATE3, QED, QSP1*, DLL0 and DLL3, which are generated by other circuits as described previously. The LATE2 and LATE3 signals are combined at a NOR gate 1532. The DLL0 and DLL2 signals are combined at a NOR gate 1534. The output of NOR gate 1534 is combined with signal QED and QSP1* at an NOR gate 1536. The signal at the output of NOR gate 1532 controls a multiplexor 1544 and a gate of a transistor 1546. Transistor 1546, when activated, pulls node 1174 to a voltage supply. Multiplexor 1544, when activated, passes the signal at the output of NOR gate 1536 to node 1174. The signal at node 1174 represents QL2 signal.

In FIG. 15, QL0 is activated HIGH when both DLL3 and QSP2 signals are HIGH. Similarly, QL1 signal is activated HIGH only when both DLL1 and QSP3 signals are HIGH. As mention in previous description, QL2 signal is always activated HIGH when the latency setting is two or three. In FIG. 15, when either LATE2 or LATE3 signal at node 1112 or 1113 is HIGH, indicating either a latency setting of two or three, the output of NOR gate 1532 at node 1540 is forced LOW. This turns on transistor 1546, connecting node 1174 to the voltage supply (HIGH). Thus, signal QL2 at node 1174 is always HIGH when either LATE2 or LATE3 is HIGH. When both LATE2 and LATE3 are LOW, indicating either a latency setting of four or five, the output of NOR gate 1532 at node 1540 is forced HIGH. This turns off transistor 1546. Thus, signal QL2 at node 1174 depends on signals QED, QSP1*, DLL0 and DLL2.

FIG. 17 also shows a timing of the operation of FIG. 15. In FIG. 17, signals QL0–QL2 are activated or make transitions to HIGH at appropriate time in relation to other signals as shown in FIG. 15. Transitions of signal QL2 is in between transitions of signal QL0. Transitions of signal QL2 is also in between transitions of signal QL1. As previously described in the description of FIGS. 6 and 7, the timing of the transitions of QL2 signal allows signals QL0 and QL1 to be properly activated. This enables data to be accurately processed during the read operation.

Figure 18:
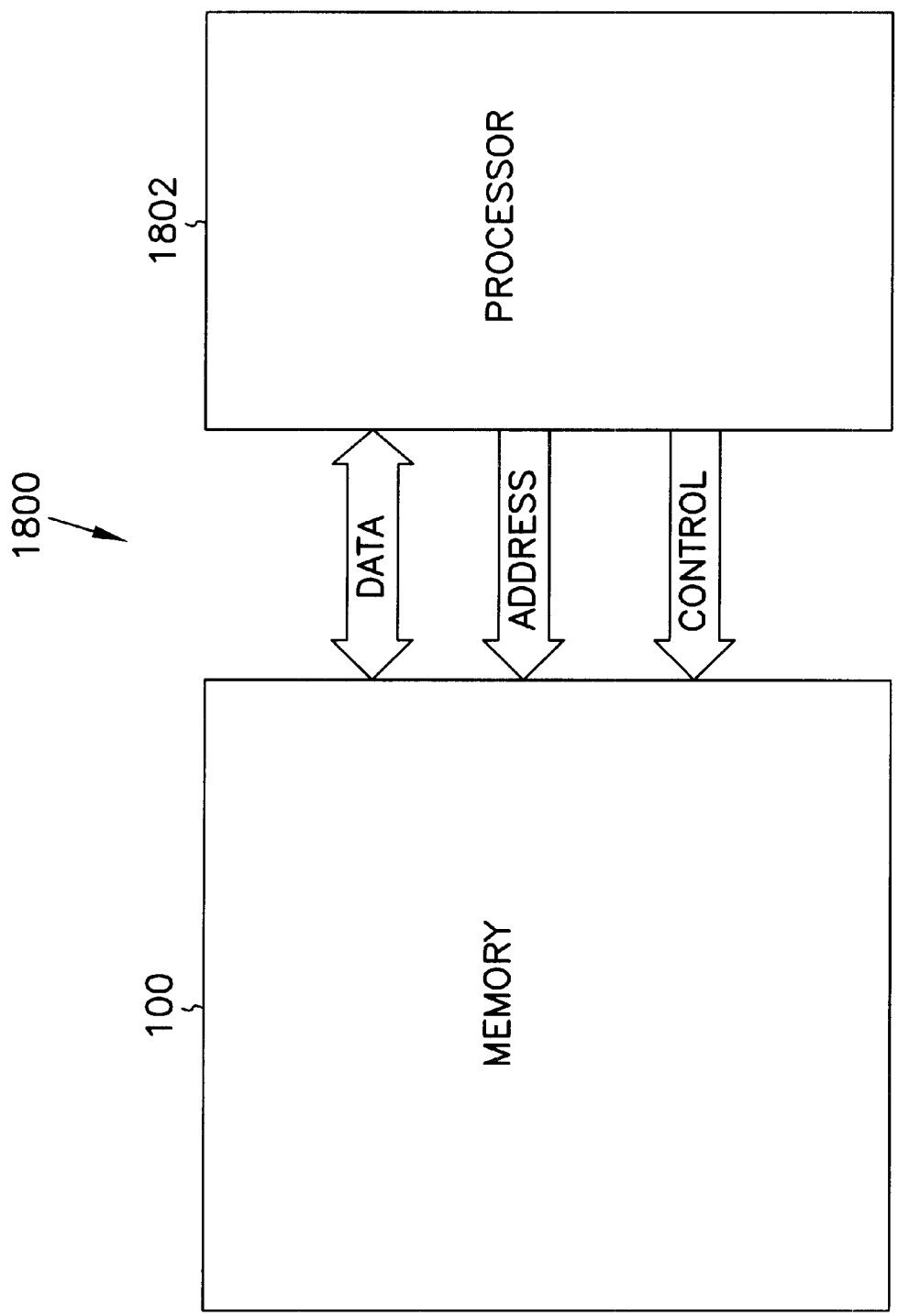
FIG. 18 is a block diagram of a system according to one embodiment of the invention.

FIG. 18 illustrates a system according to the invention. In the Figure, system 1800 includes a processor 1802 connected to a memory device 100. Memory device 100 of the invention is described above in FIG. 1. According to the invention, processor 1802 provides control signals to memory device 100 via control lines (CONTROL). Data communication between the processor and the memory is transmitted via data lines or a data bus (DATA), and addresses are provided to the memory via address lines or address bus (ADDRESS). In one embodiment, processor 1802 and memory device 100 are fabricated on a single chip.

CONCLUSION

Although specific embodiments have been illustrated and described herein, it will be appreciated by those of ordinary skill in the art that any arrangement which is calculated to achieve the same purpose may be substituted For the specific embodiment shown. This application is intended to cover any adaptations or variations of the present invention. Therefore, it is intended that this invention be limited only by the claims and the equivalents thereof.

What is claimed is:

1. An integrated circuit comprising:
    a plurality of output paths to receive a group of first, second, third and fourth data bits, each of the output paths receives the data bits in parallel;
    an output select connected to the output paths to receive the data bits from the output paths; and
    an output stage to receive data bits transferred from the output select to output the data bits to a data pad in a series and within two cycles of a clock signal, wherein the first and the third data bits in the series are output at alternate phases of a first enable signal, wherein the second and fourth data bits in the series are output at alternate phases of a second enable signal, wherein the first and second enable signals are not synchronized.

2. The integrated circuit of claim 1, wherein each of the output paths comprise:
    a plurality of input nodes to receive the data bits;
    an input select connected to the input nodes to produce a selected data bit from the data bits;
    a first latch connected to the input select to receive the selected data bit; and
    a second latch connected to the first latch to receive the selected data bit from the first latch, wherein the selected data bit from one output path is different from the selected data bit from another output path.

3. The integrated circuit of claim 2, wherein the first latches of the output paths are controlled by a first propagation control signal, the second latches of one half of the output paths are controlled by a second propagation control signal, and the second latches of the other half of the output paths are controlled by a third propagation control signal, wherein the propagation control signals are activated to pass the data bits from the latches to the output select.

4. The integrated circuit of claim 1, wherein data bits transferred from the output select to the output stage is controlled by a plurality of timing signals, wherein the timing signals are activated in sequence to serially transfer the group of bits of data from the output select to the output stage.

5. The integrated circuit of claim 1, wherein the clock signal has a frequency in a range of 66 Mega Hertz to 300 Mega Hertz.

6. An integrated circuit comprising:
a plurality of output paths, each of the output paths including:
a plurality of input nodes to receive a group of bits of data;
an input select to provide a selected bit selected from the bits of data;
a first latch connected to the input select to receive the selected bit; and
a second latch connected to the first latch to receive the selected bit from the first latch, wherein the selected bit from each of the output paths is different;
an output select connected to the output paths to receive the selected bit from each of the output paths; and
an output stage connected to the output select, the output stage serially receiving selected bits from the output select and providing the selected bits to a data pad in two clock cycles.

7. The integrated circuit of claim 6, wherein a number of output paths is four.

8. The integrated circuit of claim 6, wherein the first latches of all the output paths are controlled by a first propagation control signal, and the second latches of one half of the output paths are controlled by a second propagation control signal, and the second latches of the other half of the output paths are controlled by a third propagation control signal.

9. The integrated circuit of claim 6, wherein data transferred from the output select to the output stage is controlled by a plurality of timing signals, wherein the timing signal are activated in sequence to serially transfer the group of bits of data from the output select to the output stage.

10. An integrated circuit comprising:
a plurality of input nodes to receive a group of M bits of data in parallel;
a data pad; and
N output paths connected between the input nodes and the data pad, each of the output paths transferring different bits of the group of M bits of data, wherein the group of M bits of data are transferred to the data pad in series by activating a plurality of timing signals, the timing signals being activated at different times by a first and second enable signals, wherein the enable signals are not synchronized, wherein M and N are greater than two.

11. The integrated circuit of claim 10, wherein M equals N.

12. The integrated circuit of claim 10, wherein M is four, and N is four.

13. An integrated circuit comprising:
a plurality of input nodes to receive a group of M bits of data in parallel;
a data pad; and
N output paths connected between the input nodes and the data pad, each of the output paths transferring different bits of the group of M bits of data, wherein the group of M bits of data are transferred to the data pad in series by activating a plurality of timing signals, the timing signals being activated at different times by a first and second enable signals, wherein the enable signals are not synchronized, wherein M and N are greater than two, wherein one half of the M bits of data is transferred to the data pad in a first clock cycle by activating a first two timing signals, and another half of the M bits of data is transferred to the data pad in a second clock cycle by activating a second two timing signals, wherein M is greater than two.

14. An integrated circuit comprising:
a plurality of input nodes to receive a group of M bits of data in parallel;
a data pad; and
N output paths connected between the input nodes and the data pad, each of the output paths transferring different bits of the group of M bits of data, wherein the group of M bits of data are transferred to the data pad in series by activating a plurality of timing signals, the timing signals being activated at different times by a first and second enable signals, wherein the enable signals are not synchronized, wherein M and N are greater than two, wherein one of the first two timing signals is activated following a falling edge of the first enable signal, the other one of the first two timing signals is activated following a rising edge of the second enable signal, and wherein one of the second two timing signal is activated following rising edge of the first enable signal, and the other one of the second two timing signals is activated following falling edge of the second enable signal.

15. A memory device comprising:
a plurality of memory cells to store a plurality of data bits;
a plurality of output paths to receive a group of first, second, third and fourth data bits from the memory cells, each of the output paths receives the data bits in parallel;
an output select connected to the output paths to receive the data bits from the output paths; and
an output stage to receive data bits transferred from the output select to output the data bits to a data pad in a series and within two cycles of a clock signal, wherein the first and the third data bits in the series are output at alternate phases of a first enable signal, wherein the second and the fourth data bits in the series are output at alternate phases of a second enable signal, wherein the first and second enable signals are not synchronized.

16. The memory device of claim 15, wherein each of the output paths selects a data bit from the group of the data bits, wherein each data bit selected from each of the output paths is different.

17. The memory device of claim 15, wherein each of the output paths selects a data bit from the data bits according to logic values of address bits of the memory device.

18. The memory device of claim 15, wherein the output stage outputs the data bits according logic values of address bits of the memory device.

19. A memory device comprising:
a plurality of memory cells to store a plurality of bits of data;
a plurality of output paths, each of the output paths including:
a plurality input nodes to receive a group of bits of data from the memory cells;
an input select to provide a selected bit selected from the bits of data;
a first latch connected to the input select to receive the selected bit; and
a second latch connected to the first latch to receive the selected bit from the first latch, wherein the selected bit from each of the output paths is different;
an output select connected to the output paths to receive the selected bit from each of the output paths; and
an output stage connected to the output select, the output stage serially receiving selected bits from the output select and providing the selected bits to a data pad in two clock cycles.

20. The memory device of claim 19, wherein the first latches of the output paths are controlled by a first propagation control signal, the second latches of one half of the output paths are controlled by a second propagation control signal, and the second latches of the other half of the output paths are controlled by a third propagation control signal, wherein the propagation control signals are activated to pass the data bits from the latches to the output select.

21. The memory device of claim 20, wherein the first propagation signal is always activated when a first output bit of data at the data pad occurs within two clock cycles after the memory device receives a read command.

22. The memory device of claim 20, wherein the first propagation control signal is always activated when a first output bit of data at the data pad occurs within three clock cycles after the memory device receives a read command.

23. The memory device of claim 20, wherein the first propagation control signal is activated in between transitions of the second propagation control signal and in between transitions of the third propagation control signal when a first output bit of data at the data pad occurs within four clock cycles after the memory device receives a read command.

24. The memory device of claim 20, wherein the first propagation control signal is activated in between transitions of the second propagation control signal and in between transitions of the third propagation control signal when a first output bit of data at the data pad occurs within five clock cycles after the memory device receives a read command.

25. The memory device of claim 20, wherein the first propagation control signal is activated in between transitions of the second propagation control signal and in between transitions of the third propagation control signal when a first output bit of data at the data pad occurs more than three clock cycles after the memory device receives a read command.

26. A memory device comprising:
a plurality of memory cells to store a plurality of bits of data;
a plurality of input nodes to receive a group of M bits of data from the memory cells in parallel;
a data pad; and
N output paths connected between the input nodes and the data pad, each of the output paths transferring different bit of the group of M bits of data, wherein the group of M bits of data are transferred to the data pad in series by activating a plurality of timing signals, the timing signals being activated at different times by a first and second enable signals, wherein the enable signals are not synchronized, wherein M and N are greater than two.

27. The memory device of claim 26, wherein a number of output paths is four.

28. The memory device of claim 26, wherein M equals N.

29. The memory device of claim 26, wherein M is four, and N is four.

30. A memory device comprising:
a plurality of memory cells to store a plurality of bits of data;
a plurality of input nodes to receive a group of M bits of data from the memory cells in parallel;
a data pad; and
N output paths connected between the input nodes and the data pad, each of the output paths transferring different bit of the group of M bits of data, wherein the group of M bits of data are transferred to the data pad in series by activating a plurality of timing signals, the timing signals being activated at different times by a first and second enable signals, wherein the enable signals are not synchronized, wherein M and N are greater than two, wherein one half of the M bits of data are transferred to the data pad in a first clock cycle by activating first two timing signals, and another half of the M bits of data are transferred to the data pad in a second clock cycle by activating second two timing signals, wherein M is greater than two.

31. A system comprising:
a processor; and
a memory device connected to the processor, the memory device comprising:
a plurality of memory cells to store a plurality of bits of data;
a plurality input nodes to receive a group of M bits of data from the memory cells in parallel;
a data pad; and
N output paths connected between the input nodes and the data pad, each of the output paths transferring different bit of the group of M bits of data, wherein the group of M bits of data are transferred to the data pad in series by activating a plurality of timing signals, the timing signals being activated at different times by a first and second enable signals,
wherein the enable signals are not synchronized, wherein M and N are greater than two.

32. The system of claim 31 further comprising:
a data bus for data communication between the processor and the memory device; and
an address bus for providing address locations of memory cells of the memory device.

33. A method of operating memory device, the method comprising:
accessing M bits of data in memory cells, wherein M is greater than two;
transferring the M bits of data in parallel to an output circuit; and
outputting the M bits of data in series to a data pad from the output circuit within two cycles of a clock signal and based on a first and second enable signals, wherein the first enable signal allows output of even bits of data to the data pad, and the second enable signal allows output of odd bits of data to the data pad.

34. The method of claim 33 further comprising:

receiving address bits;

determining a transfer order based on logic values of some of the address bits; and transferring the M bits of data from the output circuit to the data pad according to the transfer order.

35. The method of claim 33 further includes activating a plurality of timing signals based on the first and second enable signals.

36. A method of transferring data, the method comprising:

reading M bits of data in parallel to a plurality of output paths, wherein M is greater than two;

transferring the M bits of data from the output paths to an output select, wherein each of the output paths transfers different bit of data;

activating a first and second enable signals;

activating a plurality of timing signals in series and based on the enable signals;

transferring the M bits of data in series to an output stage following transitions of the timing signals; and outputting the M bits of data to a data pad within two cycles of a clock signal.

37. The method of claim 36, wherein reading M bits of data includes accessing a plurality of memory cells.

38. The method of claim 36, wherein transferring M bits of data from the output path includes selecting a different bit of data from the M bits of data on each of the output paths.

39. The method of claim 36, wherein activating first and second enable signals includes activating signals having different phases.

40. The method of claim 36, wherein activating a plurality of timing signals includes:

activating a first timing signal based on a first phase of the first enable signal;

activating a second timing signal based on a first phase of the second enable signal;

activating a third timing signal based on a second phase of the first enable signal; and activating a fourth timing signal based on a second phase of the second enable signal.

41. The method of claim 36, wherein activating a plurality of timing signals includes:

activating a first timing signal following a transition of the first enable signal;

activating a second timing signal following a transition of the second enable signal;

activating a third timing signal following a different transition of the first enable signal; and activating a fourth timing signal following a different transition of the second enable signal, wherein a transition of the first enable signal is in between a transition of the second enable signal.

42. The method of claim 36, wherein activating a plurality of timing signals includes:

activating a first timing signal following a falling edge of the first enable signal;

activating a second timing signal following a falling edge of the second enable signal;

activating a third timing signal following a rising edge of the first enable signal; and activating a fourth timing signal following a rising edge of the second enable signal, wherein the falling edge of the first enable signal is in between the falling and rising edges of the second enable signal.

43. The method of claim 36, wherein outputting the M bits of data includes:

outputting a first bit of data following an activation of a first timing signal;

outputting a second bit of data following an activation a second timing signal;

outputting a third bit of data following an activation of a third timing signal; and outputting a fourth bit of data following an activation of a fourth timing signal.

* * * * *

UNITED STATES PATENT AND TRADEMARK OFFICE
CERTIFICATE OF CORRECTION

PATENT NO. : 6,556,494 B2
DATED : April 29, 2003
INVENTOR(S) : Christopher K. Morzano and Wen Li It is certified that error appears in the above-identified patent and that said Letters Patent is hereby corrected as shown below:

Title page,
Item [56], U.S. PATENT DOCUMENTS, "6,324,118 A" reference, delete "Ooishi" and insert -- Tsukasa -- therefor.

Column 8,
Line 24, delete "3262" and insert -- 326-2 -- therefor.

Column 9,
Line 62, delete "provides" and insert -- provide -- therefor.
Line 65, delete "ande" and insert -- and -- therefor.

Signed and Sealed this

Eleventh Day of November, 2003

JAMES E. ROGAN
*Director of the United States Patent and Trademark Office*